(12) United States Patent
Amirkhany et al.

(10) Patent No.: US 9,165,615 B2
(45) Date of Patent: Oct. 20, 2015

(54) CODED DIFFERENTIAL INTERSYMBOL INTERFERENCE REDUCTION

(75) Inventors: Amir Amirkhany, Sunnyvale, CA (US); Aliazam Abbasfar, Sunnyvale, CA (US); Kambiz Kaviani, San Francisco, CA (US); Wendemagegnehu Beyene, San Jose, CA (US); Carl Werner, Los Gatos, CA (US)

(73) Assignee: Rambus Inc., Sunnyvale, CA (US)

( * ) Notice: Subject to any disclaimer, the term of this patent is extended or adjusted under 35 U.S.C. 154(b) by 382 days.

(21) Appl. No.: 13/636,515

(22) PCT Filed: Mar. 14, 2011

(86) PCT No.: PCT/US2011/028295
§ 371 (c)(1),
(2), (4) Date: Sep. 21, 2012

(87) PCT Pub. No.: WO2011/119359
PCT Pub. Date: Sep. 29, 2011

(65) Prior Publication Data
US 2013/0051162 A1    Feb. 28, 2013

Related U.S. Application Data

(60) Provisional application No. 61/317,116, filed on Mar. 24, 2010.

(51) Int. Cl.
G11C 8/00 (2006.01)
G11C 7/10 (2006.01)
G11C 7/02 (2006.01)

(52) U.S. Cl.
CPC ............... *G11C 7/1006* (2013.01); *G11C 7/02* (2013.01)

(58) Field of Classification Search
USPC ............................ 365/230.06, 233.1, 233.11
See application file for complete search history.

(56) References Cited

U.S. PATENT DOCUMENTS

| | | | |
|---|---|---|---|
| 6,356,555 B1 * | 3/2002 | Rakib et al. ................... | 370/441 |
| 6,743,985 B1 | 6/2004 | Greim et al. .................. | 174/261 |
| 7,003,605 B2 | 2/2006 | Craft et al. ..................... | 710/106 |
| 7,232,959 B2 | 6/2007 | Hsu | |
| 7,427,218 B1 | 9/2008 | Hashim et al. ................ | 439/676 |
| 8,279,094 B2 | 10/2012 | Abbasfar ........................ | 341/58 |
| 2003/0091098 A1 | 5/2003 | Manninen et al. ............. | 375/133 |
| 2004/0052375 A1 | 3/2004 | Craft et al. ..................... | 380/256 |
| 2005/0251725 A1 | 11/2005 | Huang et al. .................. | 714/752 |

(Continued)

OTHER PUBLICATIONS

Carusone et al., "Differential Signaling with a Reduced Number of Signal Paths", IEEE Transactions on Circuits and Systems—II: Analog and Digital Signal Processing, Mar. 2001, p. 294-300, vol. 48, No. 3. 7 pages.

(Continued)

*Primary Examiner* — Son Dinh
(74) *Attorney, Agent, or Firm* — The Neudeck Law Firm, LLC

(57) ABSTRACT

Encoder and decoder circuits that encode and decode a series of data words to/from a series of code words. The data words include L symbols. The code words include M symbols, where M is larger than L. A set of tightly coupled M links to convey respective symbols in each of the series of code words. The code words are selected such that between every two consecutive code words in a series of code words, an equal number of transitions from low to high and high to low occur on a subset of the M-links.

6 Claims, 38 Drawing Sheets

(56) References Cited

U.S. PATENT DOCUMENTS

2007/0076505 A1    4/2007    Radtke et al. ................ 365/222
2008/0085618 A1    4/2008    Sercu et al. .................. 439/108
2008/0088007 A1    4/2008    Quach et al. ................. 257/691

OTHER PUBLICATIONS

Zogopoulos, et al. "High-Speed Single-Ended Parallel Link Based on Three-Level Differential Encoding", IEEE Journal of Solid-State Circuits, vol. 44, No. 2, Feb. 2009. 9 pages.

Sim et al., "Multilevel Differential Encoding with Precentering for High-Speed Parallel Link Transceiver", IEEE Journal of Solid-State Circuits, vol. 40, No. 8, Aug. 2005. 7 pages.

Zogopoulos, et al., "A Low Power 4.2 Gb/s/pin Parallel Link Using Three-Level Differential Encoding," 2006 IEEE Symposium of VLSI Circuits Digest of Technical Papers, Jun. 15-17, 2006. 2 pages.

Amirkhany, Amir, International Application No. PCT/US11/028295 filed Mar. 14, 2011, re International Search Report and Written Opinion dated Nov. 18, 2011. 11 pages.

* cited by examiner

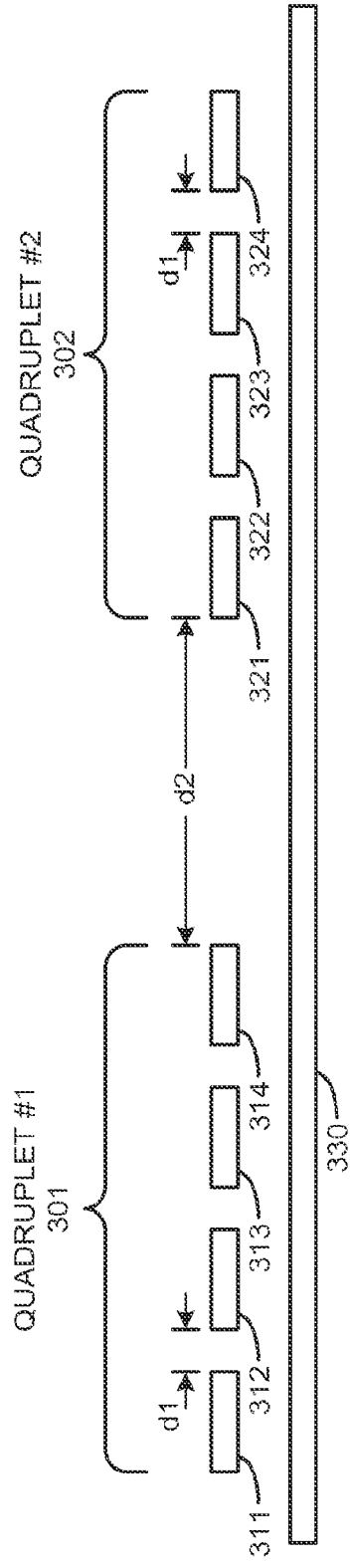
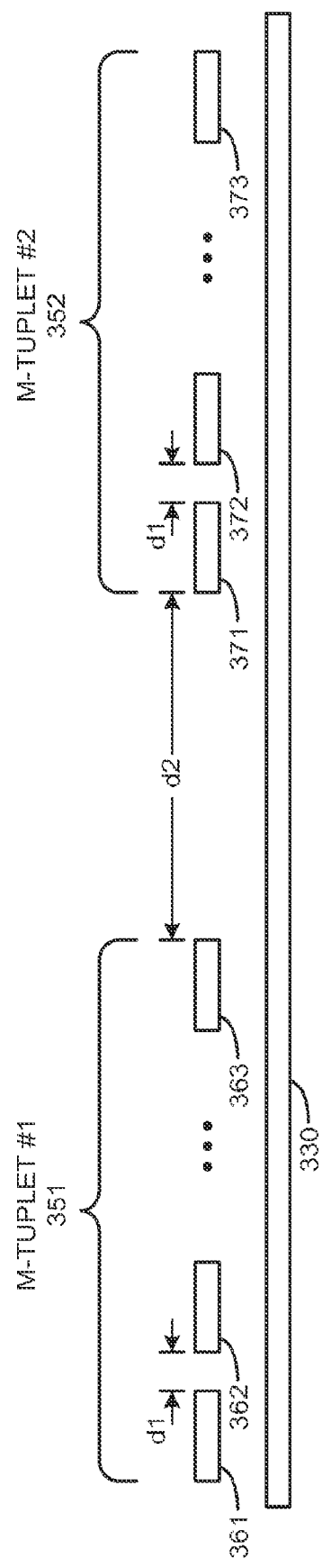

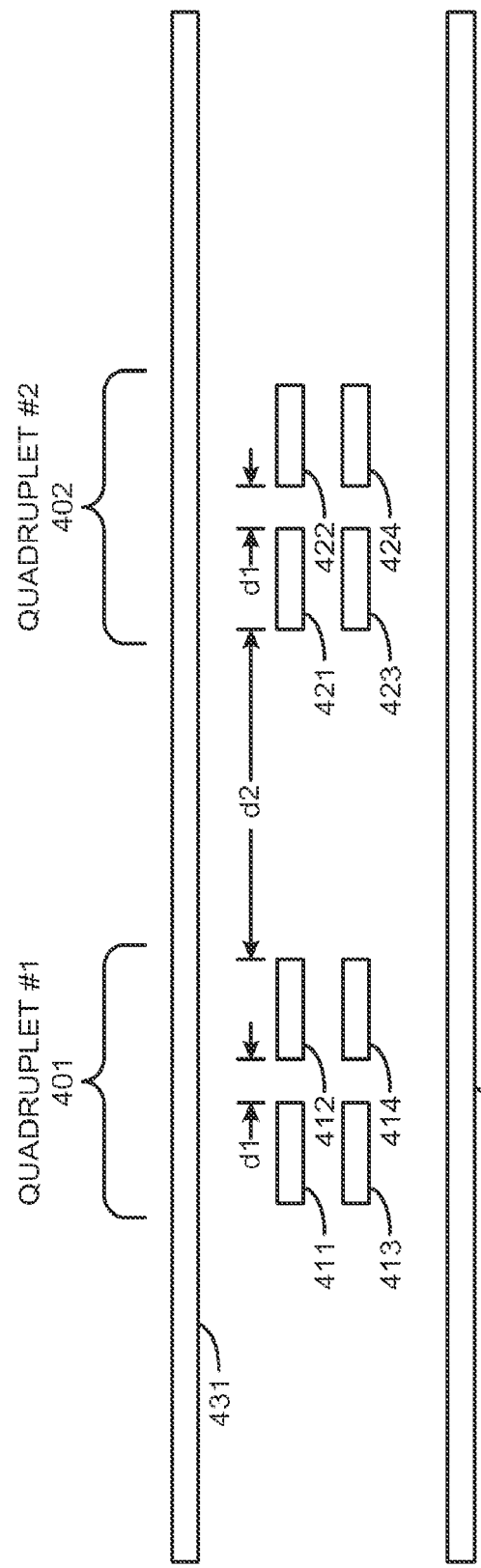

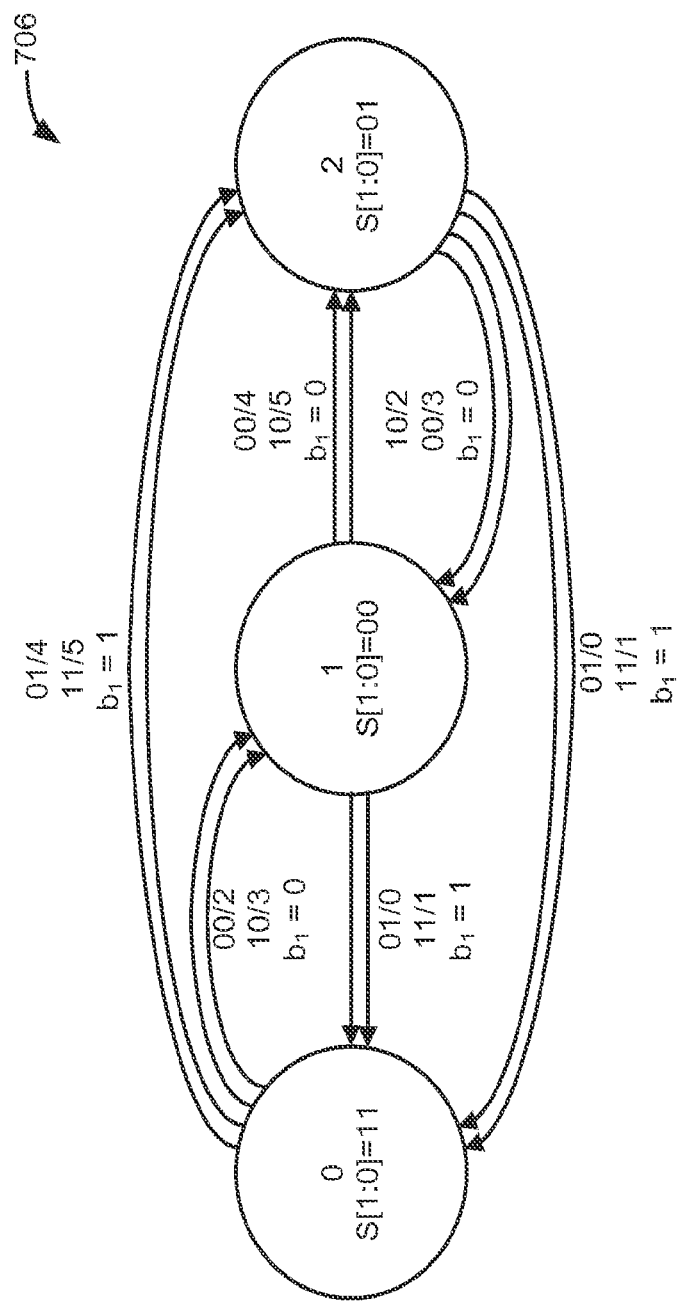

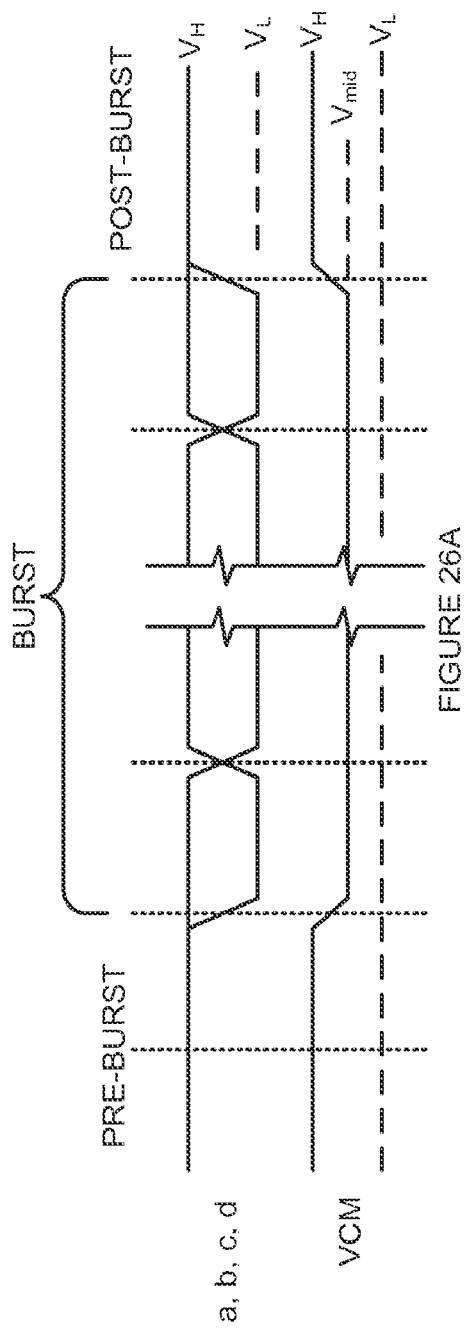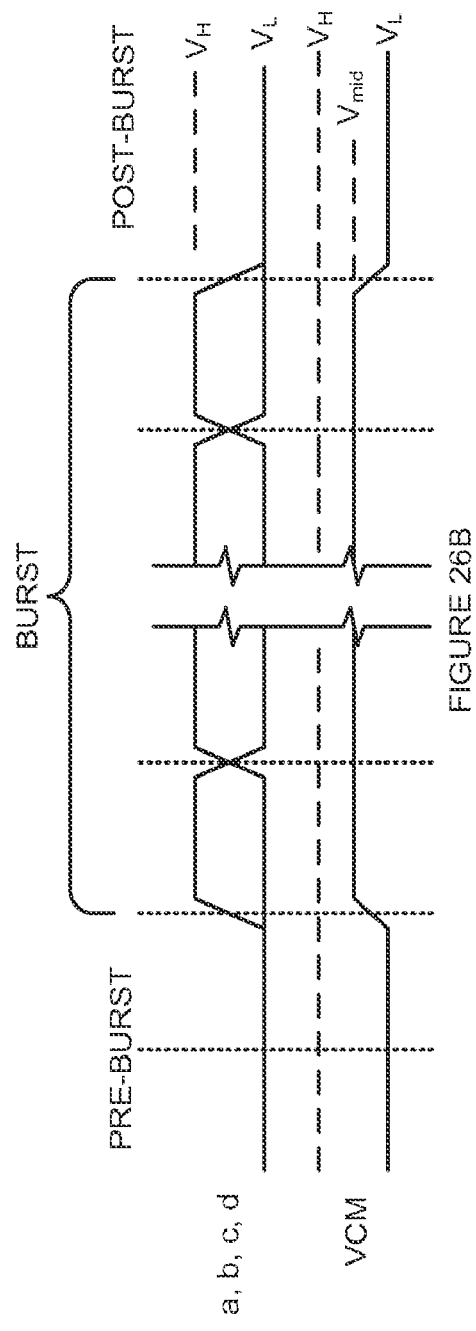

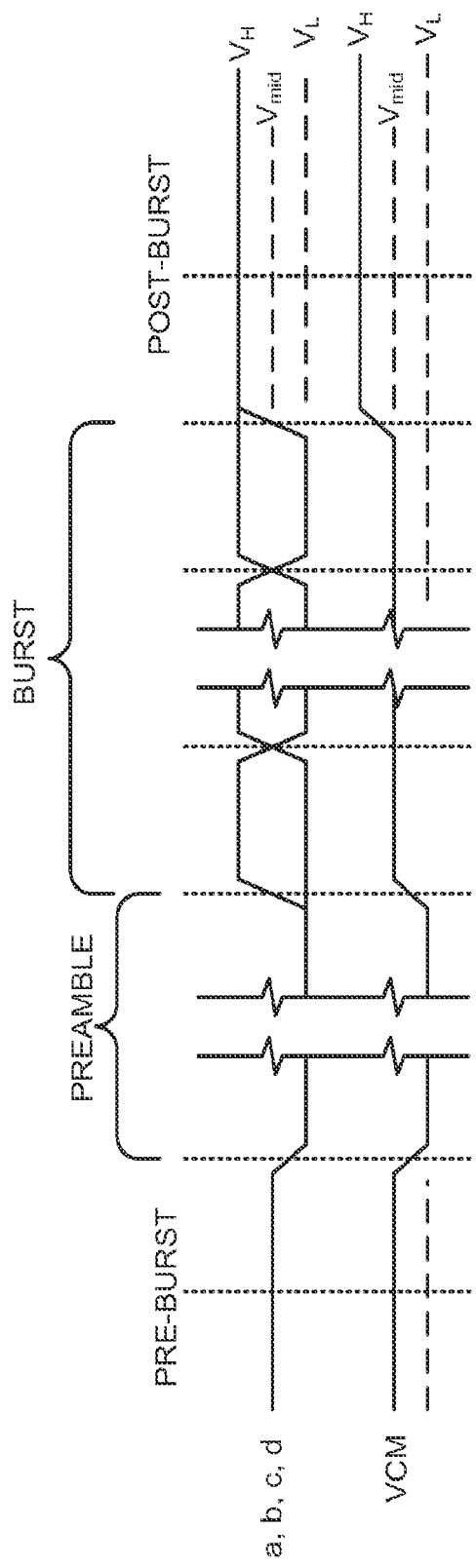

CODED DIFFERENTIAL INTERSYMBOL INTERFERENCE REDUCTION

CROSS-REFERENCE TO RELATED APPLICATION

This application is related to U.S. provisional patent application 60/982,267, titled MULTI-WIRE CODES WITH IMPROVED TIMING MARGIN, filed Oct. 24, 2007, filed as PCT application PCT/US08/074,752 on Aug. 29, 2008, and published as WO 2009-055146 on Apr. 30, 2009. This application claims the benefit of U.S. Provisional Application Ser. No. 61/317,116, filed Mar. 24, 2010, entitled CODED DIFFERENTIAL INTERSYMBOL INTERFERENCE REDUCTION, which is hereby incorporated herein by reference for all purposes.

BACKGROUND

Semiconductor memory is an important part of modern electronics. Like other silicon technology, memory has been growing in density and performance. This growth in density and performance has so far generally followed Moore's law, i.e., the number of transistors that can be placed inexpensively on an integrated circuit has doubled approximately every two years. The increase in signaling speed of memory interfaces are also strongly linked to Moore's law.

The signaling speed of memory interfaces is limited by the speed at which a given communication channel can transition between different signaling levels, which are used to communicate different symbols. The time required to transition between symbols can vary with symbol patterns, making it difficult to identify symbol boundaries at high data rates. As the symbol boundaries become less clear, inter-symbol-interference becomes a major issue in high-speed memory systems.

BRIEF DESCRIPTION OF THE DRAWINGS

FIG. 3A is an illustration of tightly coupled quadruplets.

FIG. 3B is an illustration of tightly coupled N-tuplets.

FIG. 4 is an illustration of broadside coupled quadruplets.

FIG. 7D is an illustration of a finite state machine.

FIG. 26A is a timing diagram illustrating a burst of data carried by differential-mode signals.

FIG. 26B is a timing diagram illustrating a burst of data carried by differential-mode signals.

FIG. 27B is a timing diagram illustrating a preamble and a burst of data carried by differential-mode signals.

DETAILED DESCRIPTION

In an embodiment, an integrated circuit communicates with another integrated circuit using N-M encoding, where N is the number of unencoded bits communicated per cycle, and M is the number of lines used to communicate the N bits, and typically M>N. For example, 2 bits may be communicated using the binary values on 4 lines (i.e., 2-4 encoding). The encoding of the M lines may be selected such that during each cycle the number of lines transitioning from low to high equals the number of lines transitioning from high to low. This encoding may further be selected such that the number of lines that are driven high equals the number of lines driven low. In addition, the encoding may ensure that the same number of bits transition during each cycle. E.g., for 2-4 encoding, a code may be selected that ensures, for each cycle, exactly one of the four lines transitions from low to high and another one of the four lines transitions from high to low. To increase the noise immunity of the M lines when using an N-M encoding scheme, the M lines may be routed between the integrated circuits such that they are more tightly coupled to each other than to other signal lines. An improvement in the delay differences between the M lines may be further achieved by periodically twisting the M lines as they are routed between the two integrated circuits.

The N-M encoding scheme may be used in one direction of a bidirectional bus while differential signaling is used in the other. For example, a 2-4 encoding scheme may be used to send data from a memory device to a memory controller via signal lines A,B,C, and D. Data may be sent from the memory controller to the memory device using differential signaling on two lines (e.g., A and C for a first bit, and lines B and D for a second bit). In this manner, the memory device is relieved from the task of decoding the 2-4 encoding scheme. The tight coupling and periodic twisting described previously can also benefit the signal quality of this heterogeneous bidirectional encoding of the M signal lines.

In some N-M encoding schemes, the decoded N bits may be determined by comparing the state of N pairs of the M lines (with, for example, a differential amplifier). The N pairs are determined based on the state of the M lines in the previous cycle. Thus, a critical speed path to decoding an N-M encoding scheme by selecting differential outputs can include the time it takes to decode the previous cycle. Circuits and decode architectures that remove logic and latch dependencies from this critical speed path can decrease cycle time.

Figure 1:
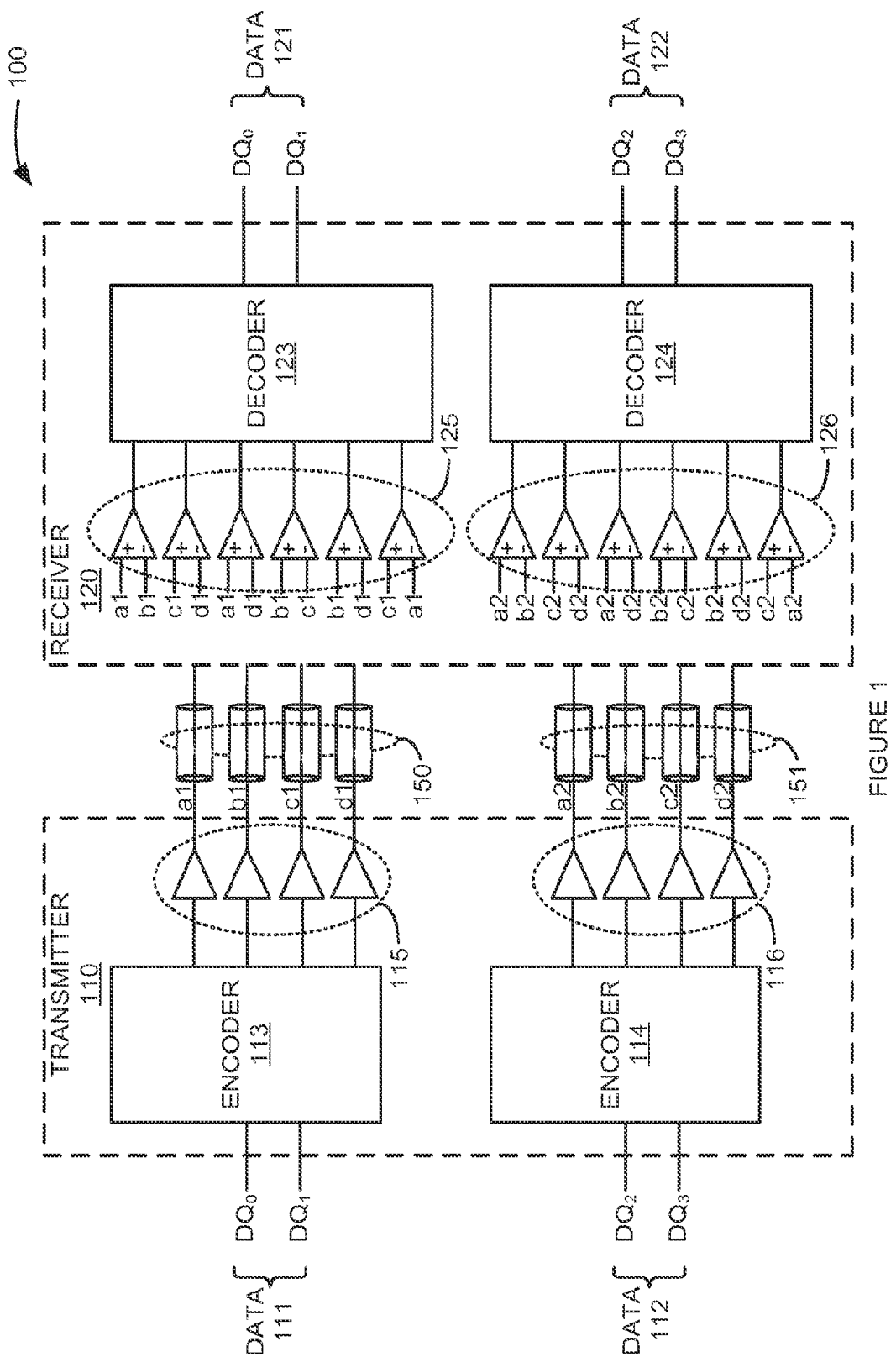
FIG. 1 is a block diagram illustrating a communication system.

FIG. 1 is a block diagram illustrating a communication system. In FIG. 1, communication system 100 comprises a transmitter 110, a receiver 120, a communication channel 150, and a communication channel 151. Transmitter 110 includes an encoder 113, an encoder 114, drivers 115, and drivers 116. Receiver 120 includes differential receivers 125, differential receivers 126, a decoder 123, and a decoder 124. Differential receivers 125 and 126 may also be referred to as samplers or slicers.

Encoder 113 receives data 111 and outputs codewords to drivers 115. The drivers 115 are coupled to communication channel 150. Communication channel 150 includes communication links a1, b1, c1, and d1. Communication links a1, b1, c1, and d1 may be single ended communication links or wires. The codewords output by drivers 115, and carried by communication channel 150, are input to differential receivers 125. Differential receivers 125 compare each combination of pairs of communication links a1, b1, c1, and d1 (i.e., a1 and b1, a1 and c1, . . . , c1 and d1). The outputs of differential receivers 125 are input to decoder 123. Decoder 123 produces data 121 which is a received version of data 111. In other words, data 111 (i.e., $DQ_0$ and $DQ_1$) is encoded by encoder 113 into codewords. These codewords are then driven by drivers 115 for reception by differential receivers 125 of receiver 120. The outputs of differential receivers 125 are decoded by decoder 123 to reproduce data 111 ($DQ_0$ and $DQ_1$) as data 121 ($DQ_0$ and $DQ_1$) at the output of receiver 120.

Encoder 114, drivers 116, communication channel 151 (links a2, b2, c2 and d2), differential receivers 126, and decoder 124 operate in a similar manner but transmit different data (i.e., data 112). Encoder 114 receives data 112 and outputs codewords to the drivers 116. The drivers 116 are coupled to communication channel 151. Communication channel 151 includes communication links a2, b2, c2, and d2. The codewords output by drivers 116 and carried by communication channel 151 are input to differential receivers 126. Differential receivers 126 compare each combination of pairs of communication links a2, b2, c2, and d2. The outputs of differential receivers 126 are input to decoder 124. Decoder 124 produces data 122 which is a received version of data 112. Thus, data 112 (i.e., $DQ_2$ and $DQ_3$) is encoded into codewords, these codewords are sent across communication channel 151, the codewords are received and then decoded back into data 122 (i.e., $DQ_2$ and $DQ_3$).

N-M encoding (and decoding) schemes suitable for use by communication system 100 are disclosed in U.S. provisional patent application 60/982,267, titled MULTI-WIRE CODES WITH IMPROVED TIMING MARGIN, filed Oct. 24, 2007, filed as PCT application PCT/US08/074,752 on Aug. 29, 2008, and published as WO 2009-055146 on Apr. 30, 2009, which is hereby incorporated herein by reference for all purposes. A particular N-M encoding scheme for N=2 and M=4 (i.e., a 2-4 encoding scheme) suitable for use by communication system 100 will be discussed later.

Figure 2:
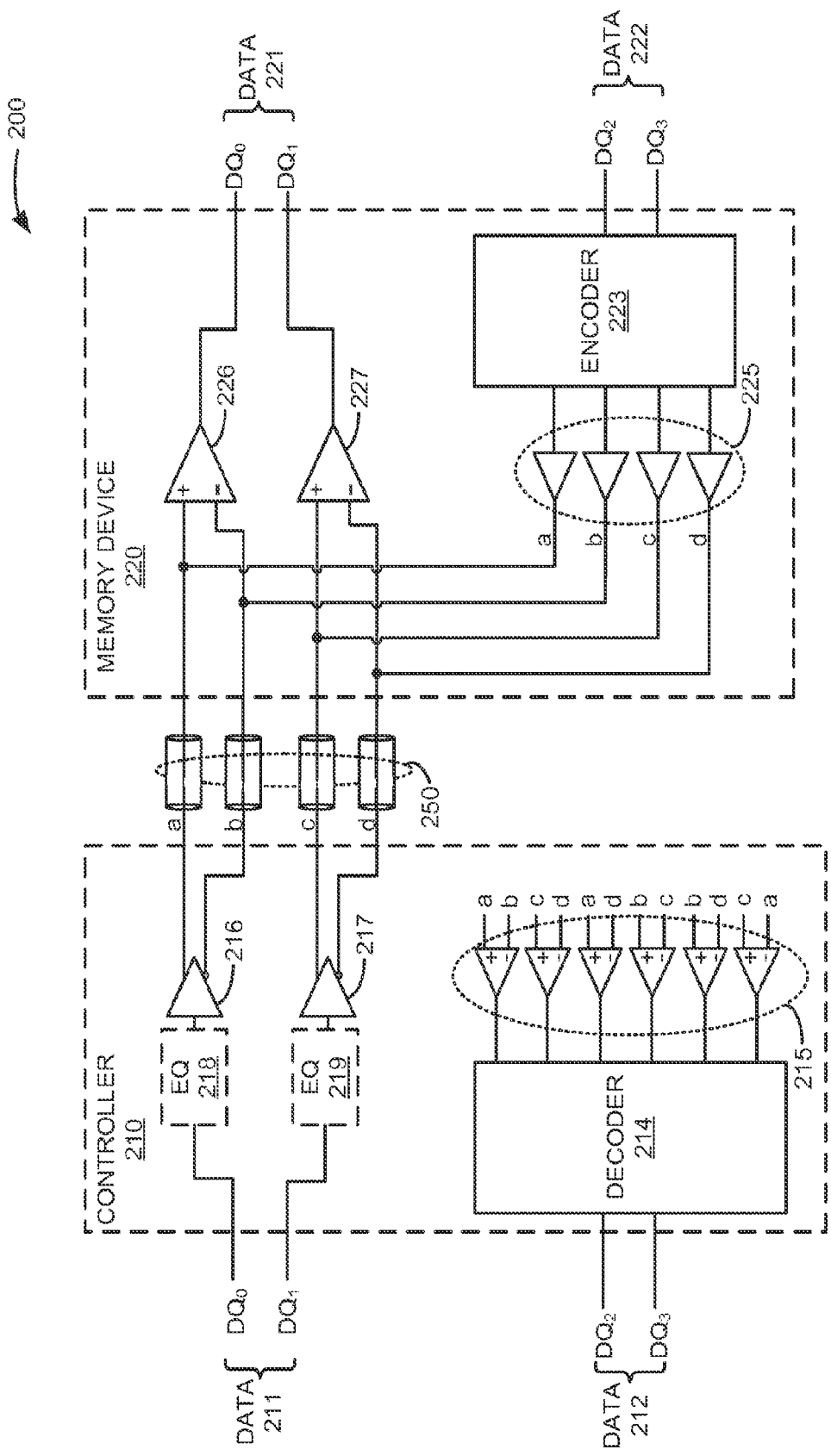
FIG. 2 is a block diagram illustrating a heterogeneous communication system.

FIG. 2 is a block diagram illustrating a heterogeneous communication system. In FIG. 2, communication system 200 sends data from controller 210 to memory device 220 across communication channel 250 using differential signaling. Data sent from memory device 220 to controller 210 via communication channel 250 is sent using an N-M encoding scheme. Thus, communication system 200 uses two different signaling/encoding schemes to send data in each direction of a bidirectional interface. One is the relatively more complicated to decode N-M encoding scheme and the other is the relatively simple to decode differential signaling.

In FIG. 2, controller 210 includes differential signaling driver 216, differential signaling driver 217, differential receivers 215, and decoder 214. Controller 210 may optionally include equalizers 218 and 219. Memory device 220 includes differential signaling receiver 226, differential signaling receiver 227, encoder 223, and drivers 225. Differential receivers 215 may also be referred to as samplers or slicers. Memory device 220 may optionally include equalizers (not shown).

Encoder 223, drivers 225, communication channel 250, differential receivers 215, and decoder 214 are coupled and function to communicate data 222 ($DQ_2$ and $DQ_3$) from memory device 220 to controller 210 using an N-M encoding scheme. The encoder 223, drivers 225, communication channel 250, differential receivers 215, and decoder 214 elements of FIG. 2 function in a similar manner, and achieve the same result (namely, transmitting N bits using M wires from a transmitting device to a receiving device) as encoder 113, drivers 115, communication channel 150, differential receivers 125, and decoder 123, respectively, of FIG. 1. Thus, a description of the coupling and functioning of these elements will be omitted here for the sake of brevity.

Differential signaling driver 216 drives a differential signal corresponding to $DQ_0$ of data 211 onto links a and b of communication channel 250. Differential signaling driver 217 drives a differential signal corresponding to $DQ_1$ of data 211 onto links c and d of communication channel 250. Optional equalizer 218 may control differential signaling driver 216 to perform signal equalization in order to equalize communication link a, communication link b, or both, by driving, for example, a virtual symbol before a target symbol. Optional equalizer 219 may control differential signaling driver 217 to perform signal equalization in order to equalize communication link c, communication link d, or both.

The differential signal driven across links a and b by differential signaling driver 216 is received by differential signaling receiver 226. The differential signal driven by differential signaling driver 217 across links c and d is received by differential signaling receiver 227. The output of differential signaling receiver 226 is $DQ_0$ of data 221. The output of differential signaling receiver 227 is $DQ_1$ of data 221. Thus, controller 210 send data 211 to memory device 220 across communication channel 250 using differential signaling.

Memory device 220 receives the differential signals sent by controller 210 via communication channel 250 to produce received data 221.

FIG. 3A is an illustration of tightly coupled quadruplets. FIG. 3A is a cross section of signal traces 311-314 and 321-324 and signal ground plane 330. Signal traces 311-314 comprise quadruplet #1 301. Signal traces 321-324 comprise quadruplet #2 302. The distance between adjacent signal traces in quadruplet #1 301 (e.g., 311 and 312) is d1. Likewise, the distance between adjacent signal traces in quadruplet #2 302 (e.g., 323 and 324) is also d1. The closest signal trace in quadruplet #1 301 to any signal trace in quadruplet #2 302 is signal trace 314. The closest signal trace in quadruplet #2 302 to any signal trace in quadruplet #1 301 is signal trace 321. In FIG. 3A, the distance between signal trace 314 and signal trace 321 is d2.

In an embodiment, signal traces 311-314 of quadruplet #1 301 are tightly coupled. In other words, signal traces 311-314 are designed, placed, and routed such that they have more electromagnetic coupling with each other than other signal traces (such as signal traces 321-324). In an example, this may be accomplished by spacing the conductors of quadruplet #1 301 closer to each other than any other conductors. This may be accomplished by designing, placing, and routing signal traces 311-314 such that at least d1<d2, and preferably d1<<d2.

In an embodiment, quadruplets #1 301 and #2 302 may be used as communication channels for N-M encoded signals. For example, quadruplet #1 301 may be used to carry a 2-4 encoding scheme as communication channel 150 in FIG. 1. Quadruplet #2 may be used as communication channel 151. If quadruplet #1 301 is used as communication channel 150, then, for example, communication link a1 may be carried by signal trace 311, b1 by signal trace 312, c1 by signal trace 313, and d1 by signal trace 314. It should be understood that other arrangements and mappings of communication links a1, b1, c1, and d1 to signal traces 311-314 are possible.

A quadruplet (e.g., quadruplet #1 301) may be used to carry two different signaling/encoding schemes to send data in each direction of a bidirectional interface. For example, quadruplet #1 may be used as communication channel 250 in FIG. 2. Thus, for example, communication link a may be carried by signal trace 311, b by signal trace 312, c by signal trace 313, and d by signal trace 314. It should be understood that other arrangements and mappings of communication links a, b, c, and d to signal traces 311-314 are possible.

In particular, separating the differential signals within a quadruplet can reduce crosstalk. For example, communication link a may be carried by signal trace 311, c by signal trace 312, b by signal trace 313, and d by signal trace 314. Thus, signal traces 311 and 313 are the positive and negative signal lines, respectively, of the differential signal driven by differential driver 216. Signal traces 312 and 314 are the positive and negative signal lines, respectively, of the differential signal driven by differential driver 217. This helps balance the crosstalk between each pair of differential signals.

FIG. 3B is an illustration of tightly coupled M-tuplets. M-tuplets can be used to carry the M links of an N-M encoding scheme. M-tuplets may be understood to be a generalization to an arbitrary number of signal traces (e.g., M signal traces) of a quadruplet shown in FIG. 3A. As such, M-tuplets may be designed, arranged, and used as described for quadruplets, except with a different number of signal traces carrying a different number of communication links.

FIG. 3B is a cross section of M*2 signal traces represented in FIG. 3B by signal traces 361-363 and 371-373 and signal ground plane 330. Signal traces 361-363 represent the M signal traces of M-tuplet #1 351. Signal traces 371-373 represent the M signal traces of M-tuplet #2 352. Similar to FIG. 3A, the distance between adjacent signal traces in M-tuplet #1 351 (e.g., 361 and 362) is d1. Likewise, the distance between adjacent signal traces in M-tuplet #2 352 (e.g., 371 and 372) is also d1. In FIG. 3B, the closest signal trace in M-tuplet #1 351 to the closest signal trace in M-tuplet #2 352 is d2.

In an embodiment, the M signal traces 361-363 of M-tuplet #1 351 are tightly coupled. In an example, this may be accomplished by spacing the conductors of M-tuplet #1 351 closer to each other than any other conductors. This may be accomplished by designing, placing, and routing signal traces 361-363 such that at least d1<d2, and preferably d1<<d2.

FIG. 4 is an illustration of broadside coupled quadruplets. FIG. 4 shows a cross section of signal traces 411-414, 421-424, and signal ground planes 430 and 431. Signal traces 411-414 and 421-424 are positioned between signal ground planes 403 and 431. Signal traces 411-414 are arranged as broadside coupled quadruplet #1 401. Signal trace 411 is positioned above signal trace 413. Signal trace 412 is positioned above signal trace 414. Signal traces 411 and 412 are adjacent to each other and are spaced at a distance d1. They also generally lie in the same plane such that they are each at approximately the same distance from ground plane 431. Signal traces 413 and 414 generally lie in the same plane such that they are each at approximately the same distance from ground plane 430. Signal traces 421-424 of broadside couple quadruplet #2 402 are laid out in a similar manner.

In FIG. 4, the distance between signal traces 411-414 and any of signal traces 421-424 is d2. Thus, the signal traces 411-414 of quadruplet #1 401 are tightly coupled. In addition, because signal trace 411 is positioned with its width above the width of signal trace 413 (and likewise for signal traces 412 and 414) greater electromagnetic coupling between these traces is achieved. This allows for the signal traces 411-414 of quadruplet #1 401 in FIG. 4 to be more tightly coupled than the signal traces 311-314 in FIG. 3B. In both FIGS. 3 and 4, tight coupling may be accomplished by designing, placing, and routing signal traces 411-414 such that at least d1<d2, and preferably d1<<d2.

Figure 5A:
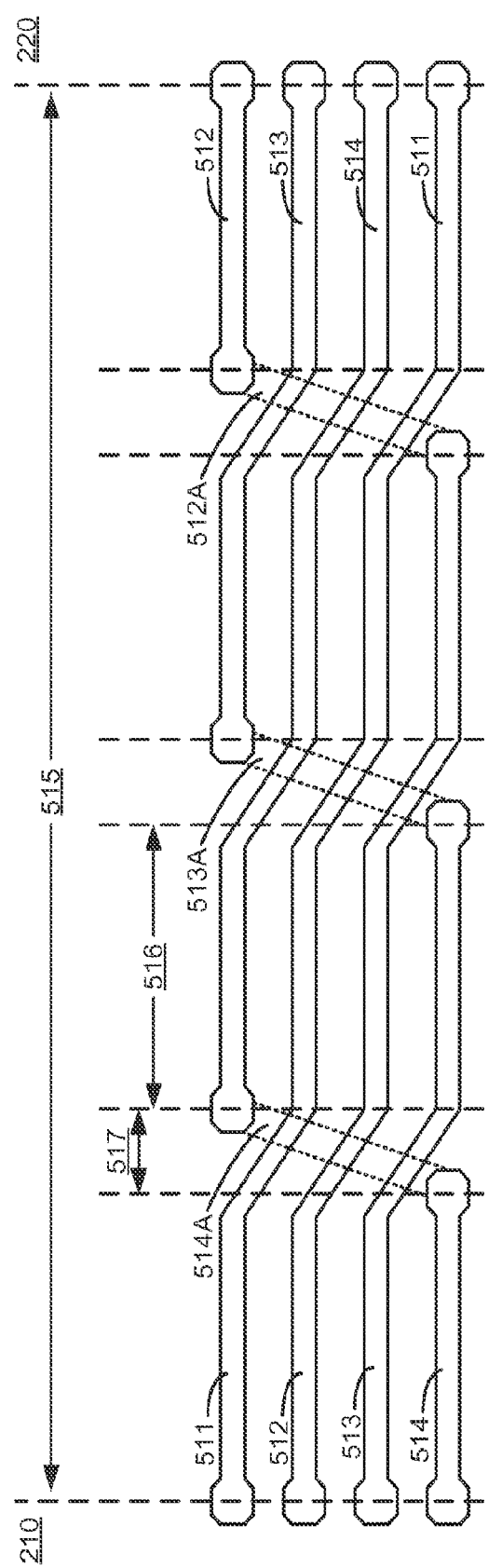
FIG. 5A is an illustration of a twisted quadruplet.

FIG. 5A is an illustration of a twisted quadruplet. FIG. 5A is a top view of signal traces 511-514. In an embodiment, a space 515 between controller 210 at one location and memory device 220 at another location is divided into segments 516 and portions of the signal traces are in each of the segments 516. In FIG. 5A, a space between controller 210 and memory 220 is divided into segments of approximately equal length. Each of these segments has a different arrangement of signal traces 511-514. Beginning with the first segment on the left of FIG. 5A and proceeding through the segments to the right, signal traces 511-514 are arranged according to the following Table 1.

TABLE 1

| Segment | Arrangement (represented as order of the signal traces from the top to the bottom of the FIG.) |
|---|---|
| Leftmost | 511, 512, 513, 514 |
| $2^{nd}$ from left | 514, 511, 512, 513 |
| $3^{rd}$ from left | 513, 514, 511, 512 |
| Rightmost | 512, 513, 514, 511 |

As shown in FIG. 5A and Table 1, in each segment in which a respective signal trace is between two other signal traces, the respective signal trace is between the same two other signal traces. For example, signal trace or conductor 512 is between two other signal traces or conductors only in the leftmost and the $2^{nd}$ from left segments and in these segments, signal trace 512 is between the same two other signal traces 511 and 513. As also shown in FIG. 5A and Table 1, each respective conductor traces is not between two conductors or signal traces in at least one of the segments, and that a total length of the respective conductor in the at least one of the segments is substantially the same as a total length of any other conductor in the segment(s) in which the other conductor is not between two conductors. For example, signal trace 511 is not between two signal traces in the leftmost and the rightmost segments, and the total length of signal trace 511 in these segments is about two times the length of each segment. Signal trace 512 is not between two signal traces in the $3^{rd}$ from the left and rightmost segments, and the total length of signal trace 512 in these segments is also about two times the length of each segment.

Between every two segments is a crossing region 517, in which at least one signal trace cross at least one other signal trace so that the arrangements of the signal traces in the segments on two sides of the crossing region are different. In one embodiment, in the crossing region 517, signal trace at the bottom of the Figure in one segment crosses the other traces to become the signal trace at the top of the Figure for the next segment. The crossing may be made under the other traces. This is shown in FIG. 5A as cross-under 514A between the leftmost and the $2^{nd}$ from left segments; cross-under 513A between the $2^{nd}$ from left and the $3^{rd}$ from left segments; and, cross-under 512A between the $3^{rd}$ from left and the rightmost segments. It should be understood that the twisted quadruplet shown in FIG. 5A may be repeated any number of times. In this manner, each of the four arrangements of segments carry the signals sent along signal traces 511-514 for substantially the same distance. In other words, a total length of a signal trace in any one of the set of arrangements is approximately equal to a total length of the same signal trace in any other of the set of arrangements.

Figure 5B:
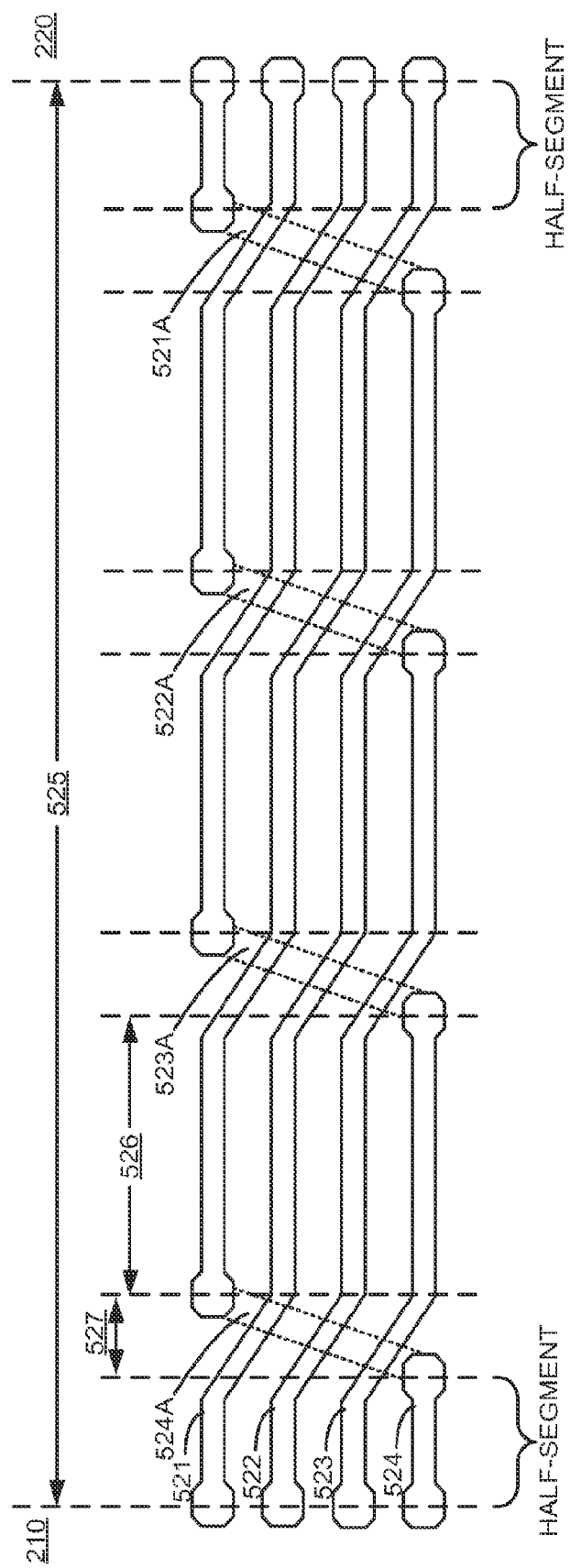
FIG. 5B is an illustration of a twisted quadruplet.

FIG. 5B is an illustration of a twisted quadruplet. The twisted quadruplet in FIG. 5B is similar to FIG. 5A except that the order of the signal traces 521-524 is the same at the left side of the quadruplet as the right side of the quadruplet. This is accomplished by having an additional segment or two half-segments. The additional segment (or half-segments) allows for an additional crossunder. This crossunder restores the original order of the signal traces.

FIG. 5B is a top view of signal traces 521-524. In an embodiment, a space 525 between controller 210 at one location and memory device 220 at another location is divided into segments 526 and portions of the signal traces are in each of the segments 526. In FIG. 5B, signal traces 521-524 are divided into middle segments of approximately equal length and two end segments each approximately ½ the length of each of the middle segments. Each of the middle segments has a different arrangement of signal traces 521-524. Beginning with the first segment on the left of FIG. 5B and proceeding through the segments to the right, ending with a half-segment on the right, signal traces 521-524 are arranged according to the following Table 2.

TABLE 2

| Segment | Arrangement (represented as order of the signal traces from the top to the bottom of the FIG.) |
|---|---|
| Leftmost half-segment | 521, 522, 523, 524 |
| $2^{nd}$ from left | 524, 521, 522, 523 |
| $3^{rd}$ from left | 523, 524, 521, 522 |
| $4^{th}$ from left | 522, 523, 524, 521 |
| Rightmost half-segment | 521, 522, 523, 524 |

As shown in FIG. 5B and Table 2, in each segment in which a respective signal trace is between two other signal traces, the respective signal trace is between the same two other signal traces. For example, signal trace or conductor 522 is between two other signal traces or conductors only in the leftmost, the $2^{nd}$ from left and the rightmost segments or half segments, and in these segments or half segments, signal trace 522 is between the same two other signal traces 521 and 523. As also shown in FIG. 5B and Table 2, each respective conductor traces is not between two conductors or signal traces in at least one of the segments, and that a total length of the respective conductor in the at least one of the segments is substantially the same as a total length of any other conductor in the segment(s) in which the other conductor is not between two conductors. For example, signal trace 521 is not between two signal traces in the leftmost, the $4^{th}$ from left, and the rightmost segments, and the total length of signal trace 521 in these segments is about two times the length of each middle segment. Signal trace 522 is not between two signal traces in the $3^{rd}$ from the left and the $4^{th}$ from left segments, and the total length of signal trace 522 in these segments is also about two times the length of each middle segment.

Between every two segments is a crossing region 527, in which at least one signal trace cross at least one other signal trace so that the arrangements of the signal traces in the segments on two sides of the crossing region are different. In one embodiment, in each crossing region 527, the signal trace at the bottom of the Figure in one segment crosses the other signal traces to become the signal trace at the top of the Figure for the next segment. The crossing may be made under the other traces. This is shown in FIG. 5B as crossunder 524A between the leftmost half-segment and the $2^{nd}$ from left segment; crossunder 523A between the $2^{nd}$ from left and the $3^{rd}$ from left segments; crossunder 522A between the $3^{rd}$ from left and the $4^{th}$ from left segments; and, crossunder 521A between the $4^{th}$ from left and the rightmost half-segment. It should be understood that the twisted quadruplet shown in FIG. 5B may be repeated any number of times (e.g., P times where P is an integer greater than or equal to 1). In this manner, each of the four arrangements of segments carry the signals sent along signal traces 521-524 for substantially the same distance. In other words, a total length of a signal trace in any one of the set of arrangements is approximately equal to a total length of the same signal trace in any other of the set of arrangements. In addition, the length of each segment, or the length of each arrangement, may be adjusted to optimize timing characteristics (e.g., timing margin or overall delay) at receivers coupled to an end of a twisted quadruplet.

The twisted quadruplets illustrated in FIGS. 5A and 5B reduce delay differences between signals sent via the conductors of the twisted quadruplet. Thus, signals sent via these twisted quadruplets propagate from one end to the other (e.g., from the start of the leftmost segment to the end of the rightmost segment) with approximately the same delay. This reduced difference in propagation delay can improve received eye diagrams for N-M coding schemes and differential signaling.

Figure 5C:
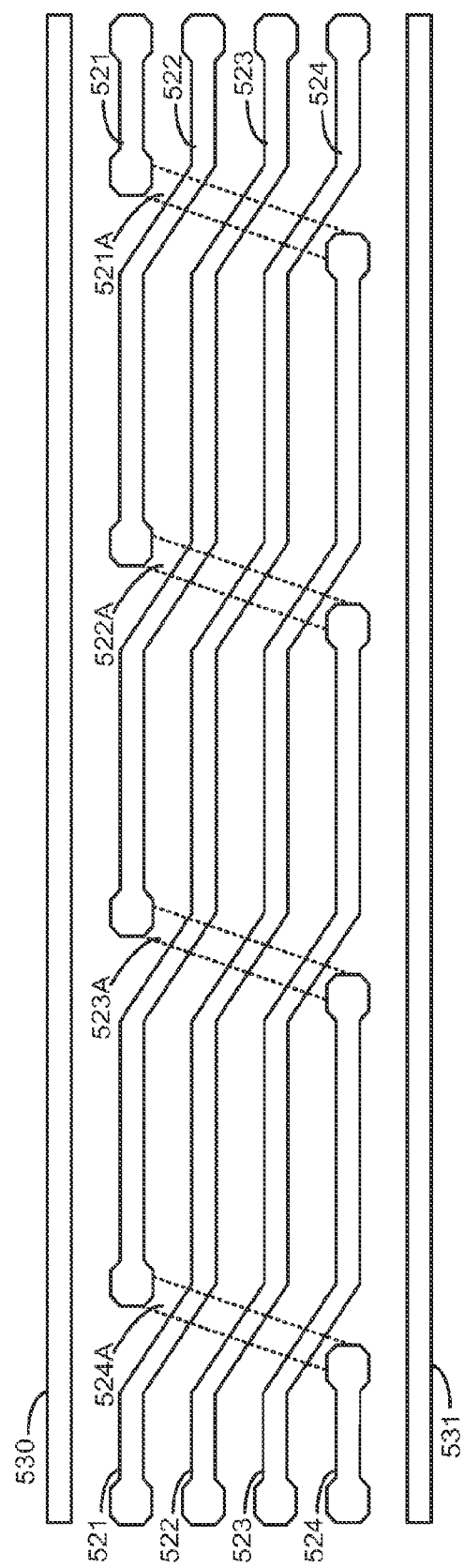
FIG. 5C is an illustration of a twisted quadruplet with ground guard traces.

The delay difference between signals sent via the conductors of the twisted quadruplet can further be improved by introducing two ground guard traces 530 and 531 around quadruplets. These guard traces 530 and 531 also improve the matching of the impedance of the lines in the quadruplet. The quadruplet of FIG. 5B with the guard traces 530 and 531 is illustrated in FIG. 5C. The ground guard traces can also be placed around the quadruplets or M-tuplets (whether twisted or not) to improve the matching of impedance and propagation delay. For example, ground guard traces can be placed around the tuplets illustrated in FIGS. 3A and 3B. In particular, signal traces 361 and 363 of M-tuplet #1 351, and signal traces 371 and 373 of M-tuplet #2 352 may be connected to ground to become ground guard traces. In this case, M-tuplet #1 351 and M-tuplet #2 352 would become (M−2)-tuplets (i.e., they would carry M−2 signals).

It should be understood that the twisting technique shown in FIGS. 5A and 5B may be generalized for different numbers of signal traces. For example, six conductors may be routed using six arrangements over six segments (or 5 segments and 2 half-segments) with 5 crossovers. In general, where the leftmost and rightmost segments (e.g., half-segments) use the same arrangement, (P*M)+1 segments are required (counting half-segments as a segment even though its length is shorter), where M is the number of signal traces and P is an integer greater than or equal to 1.

Figure 5D:
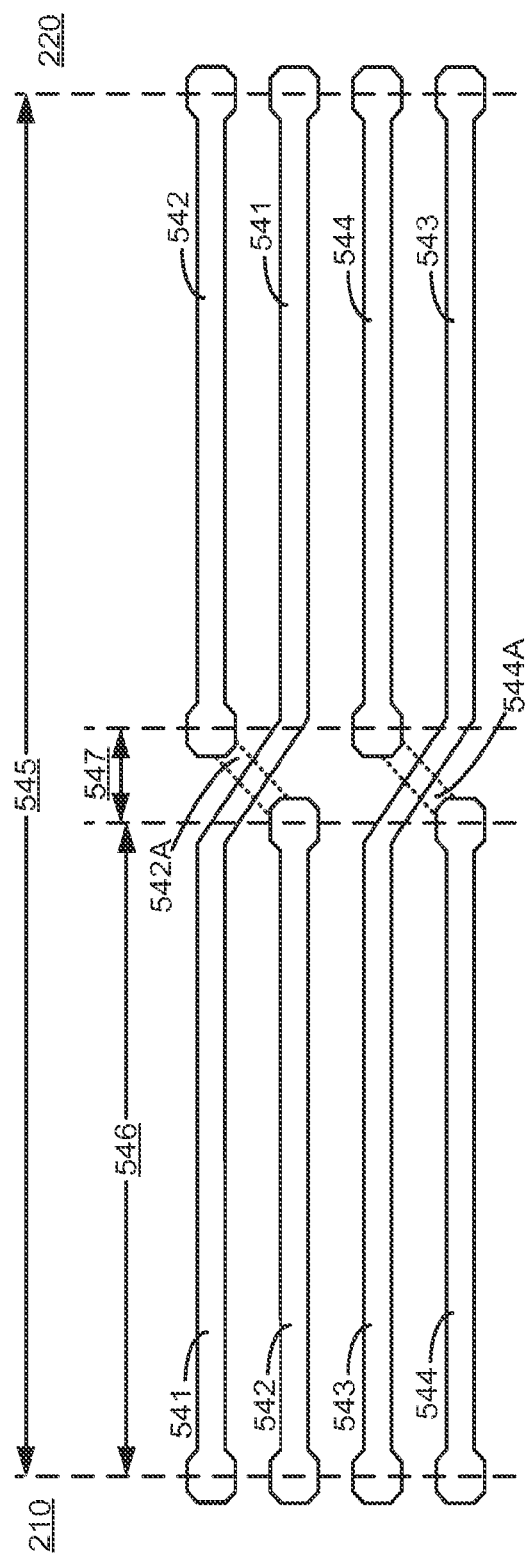
FIG. 5D is an illustration of quadruplet with paired twisting.
Figure 5E:
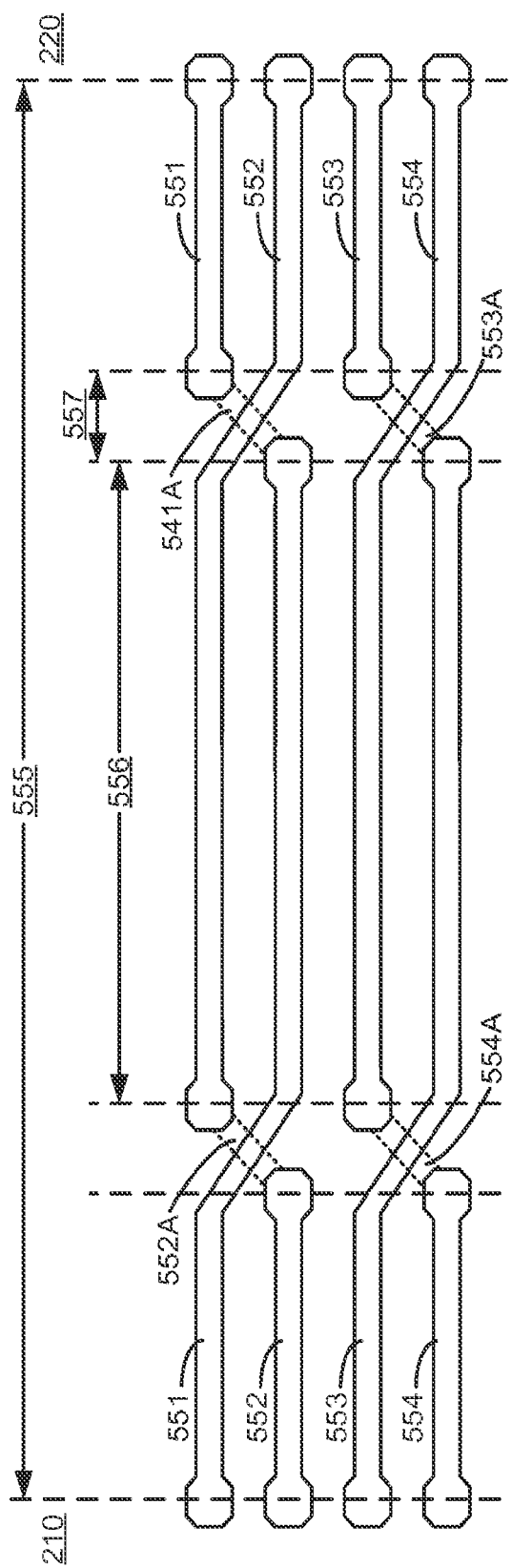
FIG. 5E is an illustration of quadruplet with paired twisting.

In other embodiments, shown if FIGS. 5D and 5E, adjacent conductors are paired and then twisted either once (FIG. 5D) or twice (FIG. 5E). FIG. 5D is a top view of signal traces 541-544. In an embodiment, a space 545 between controller 210 at one location and memory device 220 at another location is divided into segments 546 and portions of the signal traces are in each of the segments 546. In FIG. 5D, signal traces 541-544 are divided into two segments of approximately equal length. These two segments have a different arrangement of signal traces 541-544. Beginning with the segment on the left of FIG. 5D and proceeding to the segments to the right, signal traces 541-544 are arranged according to the following Table 3.

TABLE 3

| Segment | Arrangement (represented as order of the signal traces from the top to the bottom of the FIG.) |
| --- | --- |
| Left segment | 541, 542, 543, 544 |
| Right segment | 542, 541, 544, 554 |

Between every two segments is a crossing region 547. In this crossing region 547, the signal trace at the bottom of the Figure in one segment crosses the adjacent signal trace to become the signal trace second from the bottom of the Figure for the next segment. Also in this crossing region 547, the signal trace second from the top of the Figure in one segment crosses the top signal trace to become the signal trace second at the top of the Figure for the next segment. These crossings may be made under the other traces. This is shown in FIG. 5D as crossunders 542A and 544A between the left segment and right segment. It should be understood that the arrangement shown in FIG. 5D may be repeated any number of times (e.g., P times where P is an integer greater than or equal to 1). In this manner, each of the two arrangements of segments carry the signals sent along signal traces 541-544 for substantially the same distance. In other words, a total length of a signal trace in any one of the set of arrangements may be approximately equal to a total length of the same signal trace in any other of the set of arrangements. In addition, the length of each segment, or the length of each arrangement, may be adjusted to optimize timing characteristics (e.g., timing margin or overall delay) at receivers coupled to an end of a twisted quadruplet.

FIG. 5E is a top view of signal traces 551-554. In an embodiment, a space 555 between controller 210 at one location and memory device 220 at another location is divided into segments 556 and portions of the signal traces are in each of the segments 556. In FIG. 5E, signal traces 551-554 are divided into three segments. The two end segments are approximately ½ the length of the middle segment. The middle segment has a different arrangement of signal traces 551-554 than the end segments. Beginning with a half-segment on the left of FIG. 5E and proceeding through the segments to the right, ending with the half-segment on the right, signal traces 551-554 are arranged according to the following Table 4.

TABLE 4

| Segment | Arrangement (represented as order of the signal traces from the top to the bottom of the FIG.) |
| --- | --- |
| Leftmost half-segment | 551, 552, 553, 554 |
| Middle segment | 552, 551, 554, 553 |
| Rightmost half-segment | 551, 552, 553, 554 |

Between every two segments is a crossing region 557. In this crossing region 557, the signal trace at the bottom of the Figure in one segment crosses the adjacent signal trace to become the signal trace second from the bottom of the Figure for the next segment. Also in this crossing region 557, the signal trace second from the top of the Figure in one segment crosses the top signal trace to become the signal trace second at the top of the Figure for the next segment. These crossings may be made under the other traces. Thus, it can be seen that the order of segments 551-554 is the same for the leftmost half-segment and the rightmost half-segment. As described previously, between each segment, the bottom signal trace of a pair (e.g., 551 & 552) is crossed under the other trace to become the top signal trace of that pair for the next segment. This is shown in FIG. 5E as crossunders 552A and 554A between the leftmost half-segment and the middle segment, and crossunders 541A and 553A between the middle segment and the rightmost half-segment. It should be understood that the arrangement shown in FIG. 5E may be repeated any number of times (e.g., P times where P is an integer greater than or equal to 1). In this manner, each of the two arrangements of segments carries the signals sent along signal traces 551-554 for substantially the same distance. In other words, a total length of a signal trace in any one of the set of arrangements may be approximately equal to a total length of the same signal trace in any other of the set of arrangements. In addition, the length of each segment, or the length of each arrangement, may be adjusted to optimize timing characteristics (e.g., timing margin or overall delay) at receivers coupled to an end of a twisted quadruplet.

The twisted quadruplets illustrated in FIGS. 5A-E reduce delay differences between signals sent via the conductors of the twisted quadruplet. Thus, signals sent via these twisted quadruplets propagate from one end to the other (e.g., from the start of the leftmost segment to the end of the rightmost segment) with approximately the same delay. This reduced difference in propagation delay can improve received eye diagrams for N-M coding schemes and differential signaling.

It should be understood that the twisting technique shown in FIGS. 5A-E may be generalized for different numbers of signal traces. For example, six conductors may be routed using six arrangements over six segments (or 5 segments and 2 half-segments) with 5 crossovers. In another example, six conductors may be paired into three pairs, and the pairs twisted. In general, where the leftmost and rightmost segments (e.g., half-segments) use the same arrangement, (P*M)+1 segments are required (counting half-segments as a segment even though its length is shorter), where M is the number of signal traces and P is an integer greater than or equal to 1.

In an embodiment, the tight coupling illustrated in FIGS. 3A, 3B, and 4, or twisting techniques illustrated in FIGS. 5A-E may be used by channels 150, 151, or 250 in FIGS. 1 and 2. These channels may be used to communicate a first series of data words that were encoded into a first series of code words and a second series of data words that were encoded into a second series of code words. The data words may include L symbols. The code words may include M symbols, where M is larger than L. A first channel (e.g., channel 150) of M links to may convey the symbols of the first series of code words. A second channel (e.g., channel 151) of M links may convey the symbols of the second series of code words. The code words may be selected such that between every two consecutive code words in a series of code words, a fixed number of transitions from a first logic state to a second logic state occur on a first subset of a corresponding set of M-links and a fixed number of transitions from the second logic state to the first logic state occur on a second subset of the corresponding set of M links.

Figure 6:
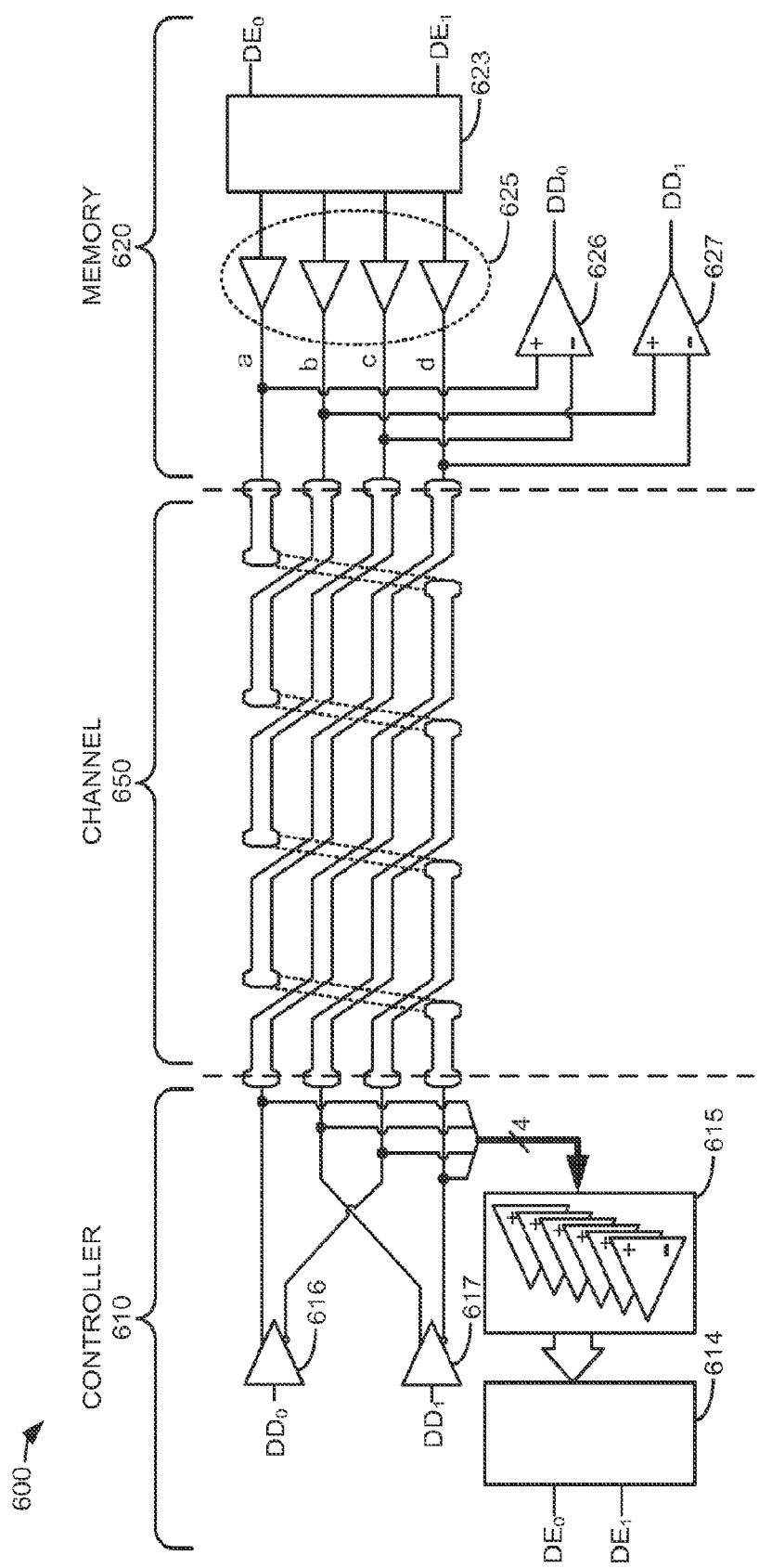
FIG. 6 is an illustration of a heterogeneous communication system using a twisted quadruplet communication channel.

FIG. 6 is an illustration of a heterogeneous communication system using a twisted quadruplet communication channel. In FIG. 6, communication system 600 comprises controller 610, memory 620, and twisted channel 650. Controller 610 includes decoder 614, differential receivers 615, differential signaling driver 616, and differential signaling driver 617. Memory 620 includes encoder 623, drivers 625, differential signaling receiver 626, and differential signaling receiver 627. In an embodiment, twisted channel 650 may be or comprise the twisted quadruplets illustrated in FIGS. 5A and 5B.

Encoder 623, drivers 625, twisted channel 650, differential receivers 615, and decoder 614 are coupled and function to communicate bits $DE_0$ and $DE_1$ from memory 620 to controller 610 using a 2-4 encoding scheme. The encoder 623, drivers 625, twisted channel 650, differential receivers 615, and decoder 614 elements of FIG. 6 function in a similar manner, and achieve the same result (namely, transmitting 2 bits using 4 wires from a transmitting device to a receiving device) as encoder 223, drivers 225, communication channel 250, differential receivers 215, and decoder 214 elements of FIG. 2, respectively, when configured as a 2-4 encoding communication system. Thus, a description of the coupling and functioning of these elements will be omitted here for the sake of brevity.

Differential signaling driver 616, differential signaling driver 617, twisted channel 650, differential signaling receiver 626, and differential signaling receiver 627 are coupled and function to communicate bits $DD_0$ and $DD_1$ from controller 610 to memory 620. Note that the positive polarity output and the negative polarity output of differential signaling driver 616 are separated by a signal trace as they traverse twisted channel 650. Likewise, the positive polarity output and the negative polarity output of differential signaling driver 617 are separated by a signal trace as they traverse twisted channel 650. This separation helps balance the crosstalk between the differential signals received by differential signaling receiver 626 and differential signaling receiver 627.

Figure 7A:
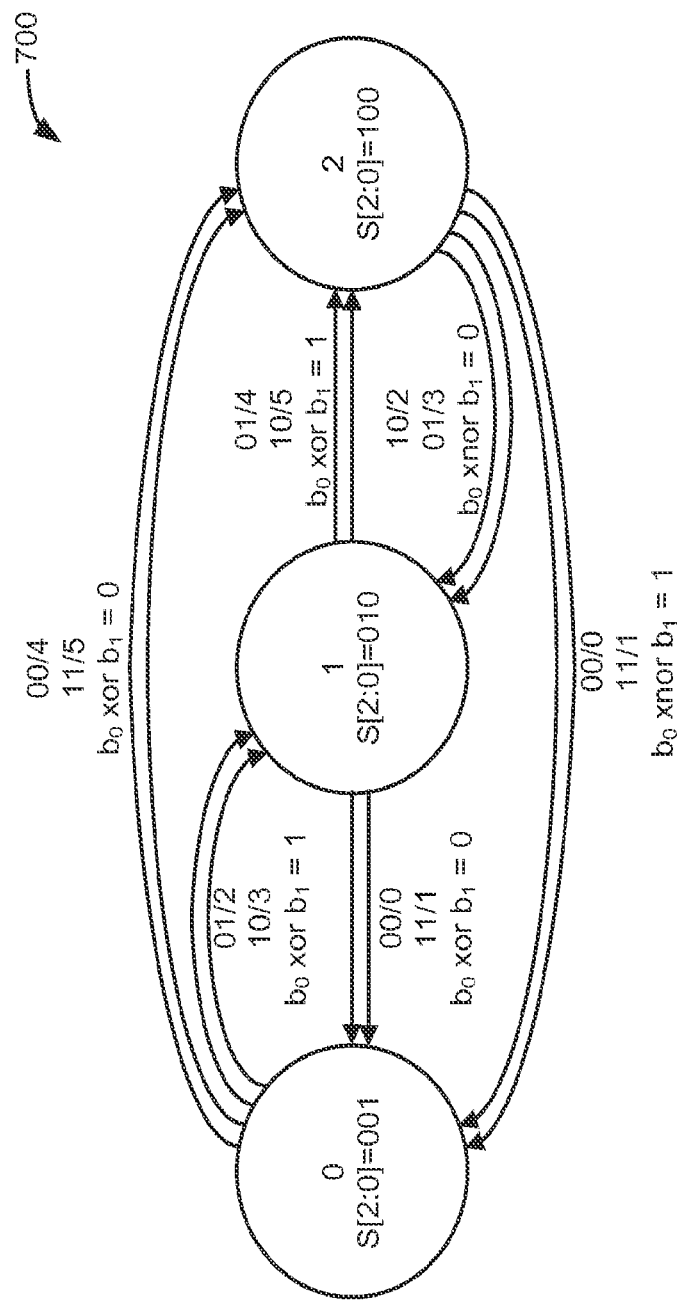
FIG. 7A is an illustration of a finite state machine.

FIG. 7A is an illustration of a finite state machine. Finite state machine 700 may describe 2-4 encoding of data by encoder 113, encoder 114, encoder 223, and encoder 623. Finite state machine 700 may also describe the decoding of 2-4 encoded data by decoder 123, decoder 124, decoder 214, and decoder 614. Finite state machine 700 corresponds to the code table shown in Table 5. The nodes 0, 1, and 2 in finite state machine 700 correspond to a state vector $S[2:0]$ where one bit is high corresponding to the state number. In other words, node 0 (a.k.a., state 0) corresponds to $S[2:0]=001$; node 1 corresponds to $S[2:0]=010$; and, node 2 corresponds to $S[2:0]=100$. (Note: the order of the array range denotes the bit ordering. Thus, $S[2:0]=100$ is the same as $S[0:2]=001$. Both forms indicate that bit $S[2]=1$.) These states (nodes) correspond to the groups of codewords associated with the previous codeword that was encoded/decoded. Four edges emanate from each node. The notation $b_0b_1/m$ has been used, in which, for decoding, $b_0b_1$ are the decoded data bits and m is the corresponding codeword number.

Also shown in FIG. 7A is a logic function performed on the decoded data bits $b_0b_1$. For transitions out of states 0 and 1, the logic function is $b_0$ XOR $b_1$. For transition out of state 2, the logic function is $b_0$ XNOR $b_1$. Note that the result of this logic function determines which state the transition leads to. For example, if the current state is state 1, and $b_0$ XOR $b_1=1$, the next state is state 2. If $b_0$ XOR $b_1=0$, the next state is state 0. Thus, in this example, if the result of the logic function is a "1", then the next state is the next highest state (with wrapping from state 2 to state 0). If the result of the logic function is a "0", then the next state is the next lower state (with wrapping from state 0 to state 2). This can also be seen as a circular rotation (a.k.a. a barrel shift) of the one high bit in the state vector $S[2:0]$. If the result of the logic function is a "1", then the next state vector is a circular rotation to the left (e.g., $S[2:0]=010$ rotates left to $S[2:0]=100$, and $S[2:0]=100$ rotates left to $S[2:0]=001$). If the result of the logic function is a "0", then the next state vector is a circular rotation to the right.

TABLE 5

| Group | Code-word | M symbols for links a b c d | Differential Receiver Outputs ||||||
|---|---|---|---|---|---|---|---|---|
| | | | a−b | c−d | a−d | b−c | b−d | a−c |
| 0 | 0 | 0 0 1 1 | x | x | 0 | 0 | 0 | 0 |
| 001 | 1 | 1 1 0 0 | x | x | 1 | 1 | 1 | 1 |
| 1 | 2 | 0 1 1 0 | 0 | 1 | x | x | 1 | 0 |
| 010 | 3 | 1 0 0 1 | 1 | 0 | x | x | 0 | 1 |
| 2 | 4 | 0 1 0 1 | 0 | 0 | 0 | 1 | x | x |
| 100 | 5 | 1 0 1 0 | 1 | 1 | 1 | 0 | x | x |

As shown in Table 5, each of the differential receivers (e.g., 125, 126, 215 and 615) can have one of three output values. Using the rightmost column, for example, the differential receiver that receives inputs 'a' and 'c' outputs:

i. a voltage representative of a logic zero (e.g., a negative voltage −Vp) when inputs a and c are zero and one, respectively;
 ii. a voltage representative of a logic one (e.g., a positive voltage +Vp) when inputs a and c are one and zero, respectively; and
 iii. an intermediate, unknown, or unreliable logic state is represented by an 'x', when inputs a and c are the same, either both one or both zero.

When finite state machine 700 is in state 0, the next codeword is one of codewords 2, 3, 4 or 5 and the outputs of the differential receivers that compare a to b and c to d should be used. For example, if finite state machine 700 is in state 0, and the receivers that detect a-b and c-d, respectively, detect 0 and 0, respectively, that means codeword 4 in group 2 was transmitted and the next state is state 2.

As illustrated in Table 5, this coding arrangement allows the decoders (decoders (e.g., 123, 124, 214, and 614) to decode the transmitted codeword using the outputs from only two of the differential receivers. In particular, if the codeword immediately preceding the current codeword was codeword 0, the outputs from the differential receivers that compare information on links a and b and on links c and d can determine the data bits corresponding to the current codeword. For example, the current codeword may be decoded using the output of the differential receiver that determines the difference of the information received on links a and b during the given time interval (e.g., a-b) and the output of the differential receiver that determines the difference of the information received on links c and d during the given time interval (e.g., c-d). Thus, if codeword 4 is used to communicate data bits $b_0b_1$=00, the outputs a-b and c-d correctly decode this codeword as data bits $b_0b_1$=00.

Note that this encoding/receiving technique facilitates a simpler receiver implementation. In particular, in this example, the receiver and decoder may include six parallel differential receivers followed by a multiplexer that directly outputs the data bits based on the group of code words associated with the codeword immediately preceding the current codeword. Alternatively, the receiver and decoder may include two comparison circuits, such as differential receivers, that are selectively coupled to the links based on the group of code words associated with the codeword immediately preceding the current codeword.

TABLE 6

| Group | Code-word | M symbols for links a b c d | Differential Receiver Outputs | | | | | |
|---|---|---|---|---|---|---|---|---|
| | | | a − b | c − d | a − d | b − c | b − d | c − a |
| 0 | 0 | 0 0 1 1 | x | x | 0 | 0 | 0 | 1 |
| 001 | 1 | 1 1 0 0 | x | x | 1 | 1 | 1 | 0 |
| 1 | 2 | 0 1 1 0 | 0 | 1 | x | x | 1 | 1 |
| 010 | 3 | 1 0 0 1 | 1 | 0 | x | x | 0 | 0 |
| 2 | 4 | 0 1 0 1 | 0 | 0 | 0 | 1 | x | x |
| 100 | 5 | 1 0 1 0 | 1 | 1 | 1 | 0 | x | x |

Table 6 illustrates another encoding scheme. Table 6 is the same as Table 5 except that the polarity of the differential receiver comparing c and a has been reversed (i.e., a-c in Table 5 is c-a in Table 6). The net effect of this change in encoding is to allow the transitions out of state 2 to be determined by the same logic function as the transitions out of states 0 and 1, namely is $b_0$ XOR $b_1$. This change is possible because inverting a single input of an XNOR gate is equivalent to an XOR gate. Thus, a single XOR gate may be used as the logic function to determine the next state.

Figure 7B:
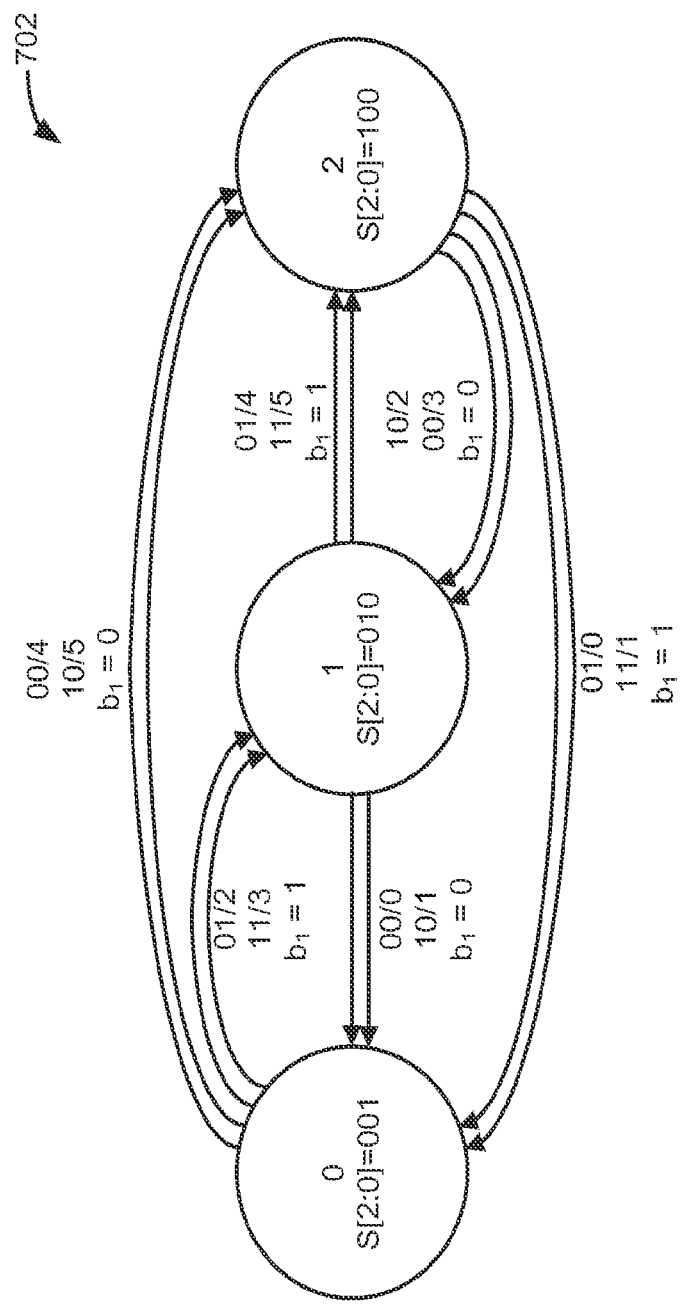
FIG. 7B is an illustration of a finite state machine.

FIG. 7B is an illustration of a finite state machine. Finite state machine 702 may describe 2-4 encoding of data by encoder 113, encoder 114, encoder 223, and encoder 623. Finite state machine 702 may also describe the decoding of 2-4 encoded data by decoder 123, decoder 124, decoder 214, and decoder 614.

In FIG. 7B the state of $b_1$ determines which state the transition leads to. For example, if the current state is state 1, and $b_1$=1, the next state is state 2. If $b_1$=0, the next state is state 0. Thus, in this example, if $b_1$=1, then the next state is the next highest state (with wrapping from state 2 to state 0). If $b_1$=0, then the next state is the next lower state (with wrapping from state 0 to state 2). This can also be seen as a circular rotation of the one high bit in the state vector S[2:0]. If the result of the logic function is a "1", then the next state vector is a circular rotation to the left (e.g., S[2:0]=010 rotates left to S[2:0]=100, and S[2:0]=100 rotates left to S[2:0]=001). If the result of the logic function is a "0", then the next state vector is a circular rotation to the right.

Figure 7C:
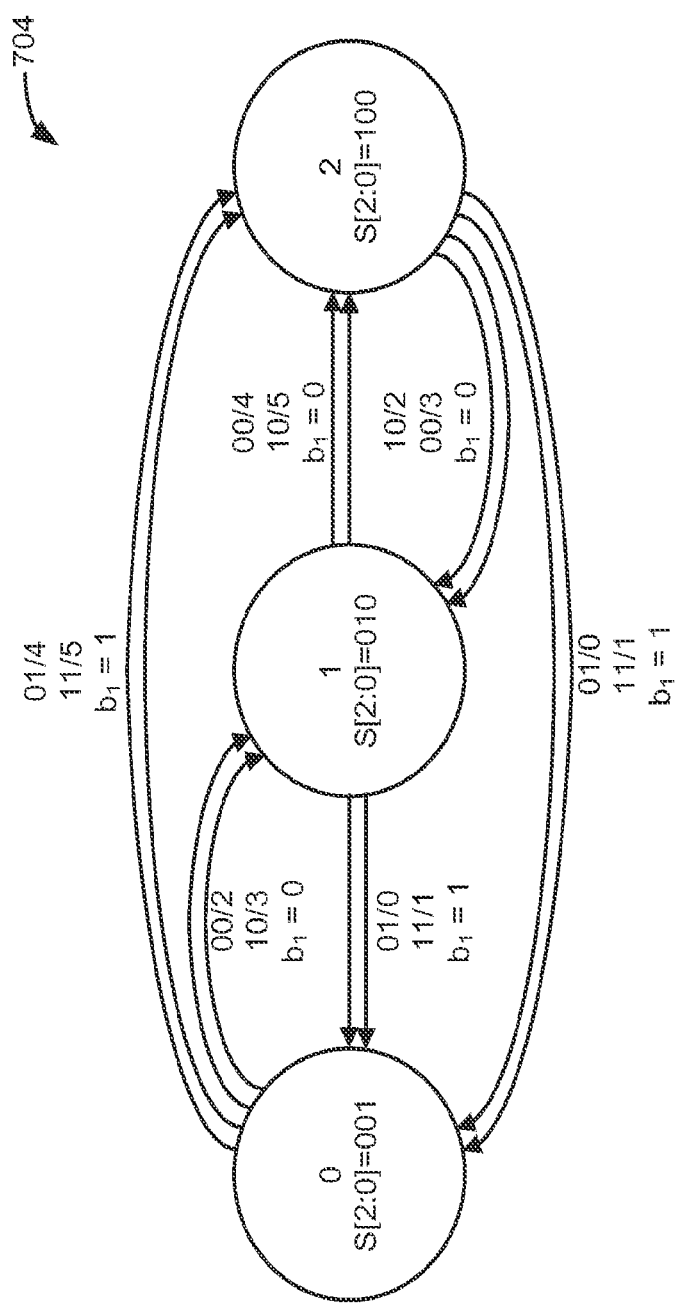
FIG. 7C is an illustration of a finite state machine.

FIG. 7C is an illustration of a finite state machine. Finite state machine 704 may describe 2-4 encoding of data by encoder 113, encoder 114, encoder 223, and encoder 623. Finite state machine 702 may also describe the decoding of 2-4 encoded data by decoder 123, decoder 124, decoder 214, and decoder 614. In FIG. 7C, like FIG. 7B, the state of $b_1$ determines which state the transition leads to. However, the direction (e.g., up or down, rotate left or rotate right) of the next state is also dependent upon the current state. In other words, for state 1 for example, if $b_1$=1 then the next state is the next lower state (e.g., state 0). However, for state 2, if $b_1$=1 then the next state is the next highest state (e.g., state 0 with wrapping).

FIG. 7D is an illustration of a finite state machine. Finite state machine 706 may describe 2-4 encoding of data by encoder 113, encoder 114, encoder 223, and encoder 623. Finite state machine 702 may also describe the decoding of 2-4 encoded data by decoder 123, decoder 124, decoder 214, and decoder 614. FIG. 7D is identical to FIG. 7C, except only two bits (S[0:1]=$S_0S_1$) are used to represent the state number. The bits S[0:1] that represent each state number are as follows: (a) state 0, S[0:1]=$S_0S_1$=11; (b) state 1, S[0:1]=$S_0S_1$=00; and, (c) state 0, S[0:1]=$S_0S_1$=01. Using these representations of the states, and the encoding/decoding specified by FIG. 7D allows relatively simple logic to be used to encode bits $b_0b_1$ into codewords.

Table 7 illustrates logic equations that may be used to implement state machine 706. In Table 7, $b_0b_1$ correspond to the bits to be transmitted; $S_0+$ and $S_1+$ correspond to $S_0S_1$ for the next state of the state machine; and a, b, c, and d correspond to the bits of the codeword as given in Tables 5 and 6.

TABLE 7

$S_0+ = \sim S_0 \& b_1$
$S_1+ = \sim(S_1 \& \sim b_1)$
$a = (\sim S_0 S_1) ? \sim(b_0 \text{ XOR } b_1): b_0$
$b = (\sim S_1) ? \sim(b_0 \text{ XOR } b_1): (S_0 \text{ XOR } b_0)$
$c = (S_0 S_1) ? \sim(b_0 \text{ XOR } b_1): (b_0 \text{ XOR } b_1)$
$d = (S_0 S_1) ? \sim(b_0 \text{ XOR } b_1): \sim b_0$ Table 8 illustrates, for each state, the symbol (from Tables 5 and 6) to be transmitted to send the corresponding bits $b_0b_1$. Thus, Table 8 also illustrates, for each state, the corresponding bits $b_0b_1$ that were sent for when the corresponding symbol (from Tables 5 and 6) is received. Table 8 corresponds to the encoding/decoding illustrated by state machine 706 and the equations of Table 7.

TABLE 8

| State 0 S[0:1] = $S_0S_1$ = 11 | | State 1 S[0:1] = $S_0S_1$ = 00 | | State 2 S[0:1] = $S_0S_1$ = 01 | |
|---|---|---|---|---|---|
| $b_0b_1$ | Codeword number | $b_0b_1$ | Codeword number | $b_0b_1$ | Codeword number |
| 00 | 2 | 00 | 4 | 00 | 3 |
| 01 | 4 | 01 | 0 | 01 | 0 |
| 10 | 3 | 10 | 5 | 10 | 2 |
| 11 | 5 | 11 | 1 | 11 | 1 |

Figure 8:
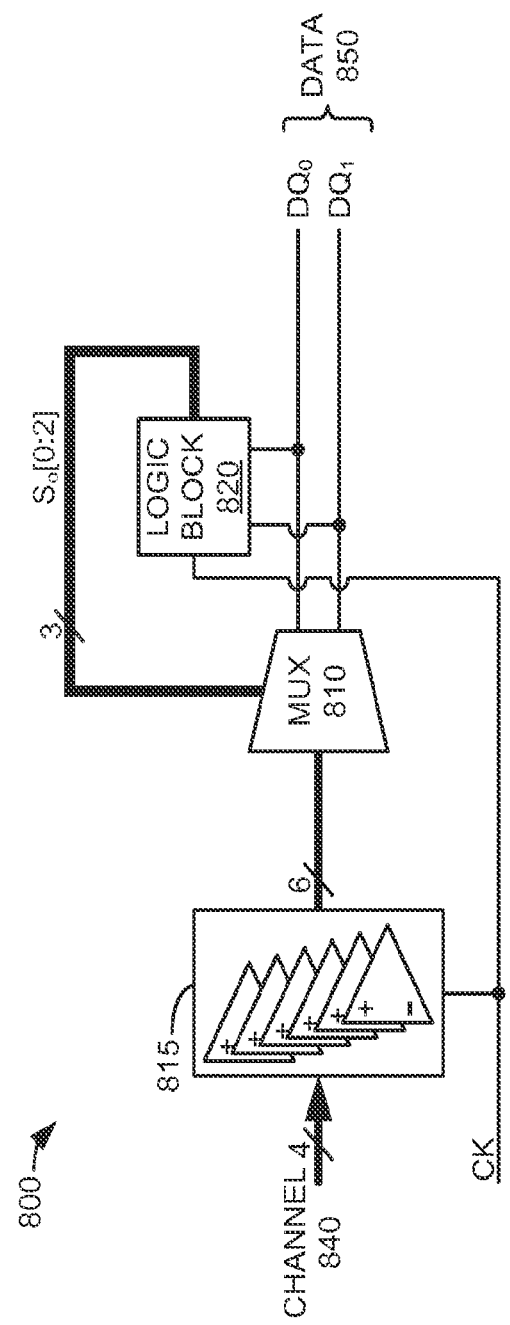
FIG. 8 is block diagram illustrating a decoder.

FIG. 8 is block diagram illustrating a decoder. In FIG. 8, decoder 800 comprises differential receivers 815, multiplexer (MUX) 810, and logic block 820. Channel 840 is input to differential receivers 815. Differential receiver 815 may also be referred to as samplers. Differential receivers 815 may be clocked by a clock signal CK. Channel 840 includes four links (e.g., a, b, c, and d). Differential receivers 815 output six comparisons between the four links (e.g., a-b, c-d, ... etc., as shown in Table 6). These six outputs are input to the data inputs of a 6:2 MUX 810. Based on the state vector S[0:2] applied to the select inputs of MUX 810, MUX 810 selects two of the six inputs to output as decoded data 850 ($DQ_0$ and $DQ_1$). $DQ_0$ and $DQ_1$ are also input to logic block 820. Based on $DQ_0$ and $DQ_1$, logic block 820 outputs the state vector S[0:2]. Logic block 820 may be clocked by clock signal CK. In an embodiment, logic block 820 implements a finite state machine for the encoding illustrated in Table 6. However, it should be understood that logic block 820 may implement a state machine for other encodings.

Figure 9:
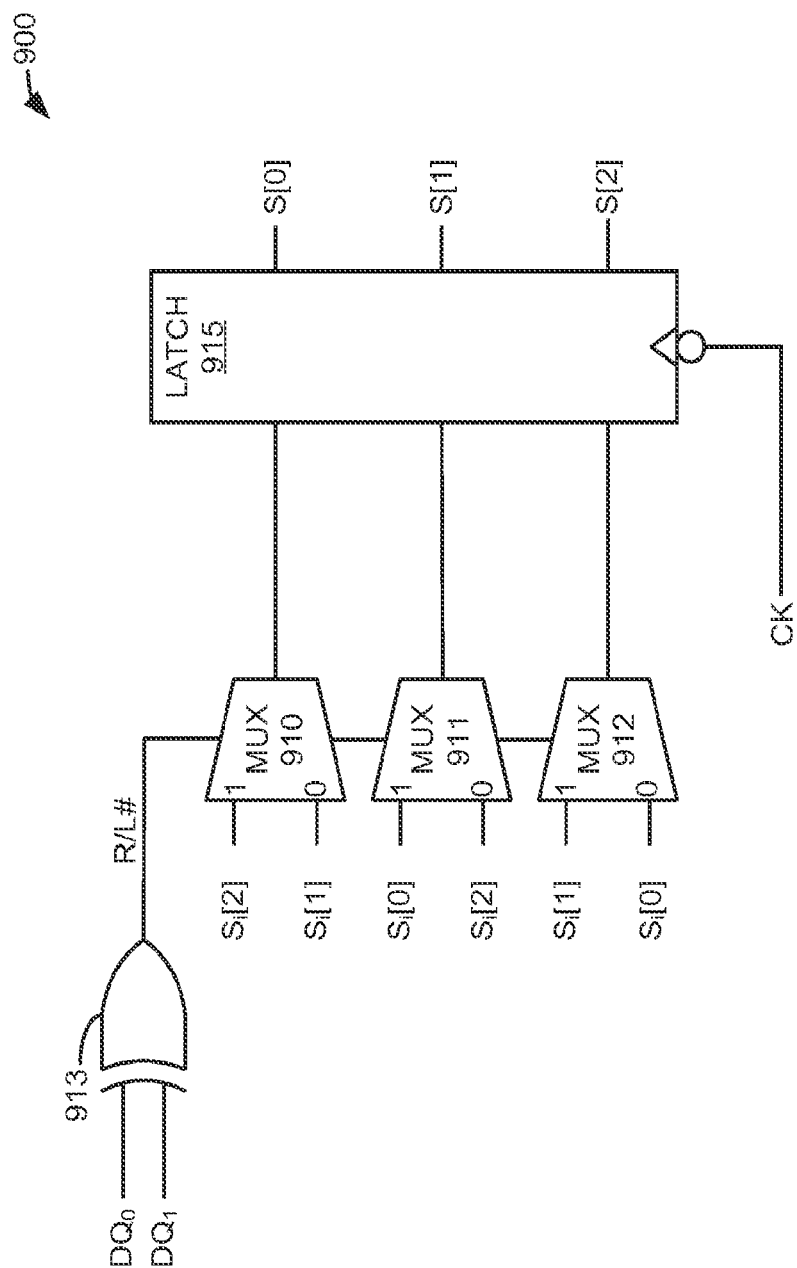
FIG. 9 is a block diagram illustrating a decoder state machine.

FIG. 9 is a block diagram illustrating a decoder state machine. State machine 900 may be used as logic block 820 in FIG. 8. State machine 900 comprises MUXs 910-912, XOR 913, and 3-bit latch 915. The output of latch 915 is the state vector S[0:2]. The inputs to XOR 913 are $DQ_0$ and $DQ_1$. The data inputs to MUXs 910-912 are derived from the state vector of the previous state $S_i[0:2]$. Based on the output of XOR 913 (R/L#), MUXs 910-912 rotate the input state vector $S_i[0:2]$. If R/L# is high, $S_i[0:2]$ is rotated right and then input to latch 915. If R/L# is low, $S_i[0:2]$ is rotated left and then input to latch 915.

R/L# is applied to the select input of MUXs 910-912 to rotate the previous state vector $S_i[0:2]$. MUX 910 has its "1" data input connected to $S_i[2]$ and its "0" input to $S_i[1]$. MUX 911 has its "1" data input connected to $S_i[0]$ and its "0" input to $S_i[2]$. MUX 912 has its "1" data input connected to $S_i[1]$ and its "0" input to $S_i[0]$. The output of MUX 910 corresponds to S[0]. The output of MUX 911 corresponds to S[1]. The output of MUX 912 corresponds to S[2]. Latch 915 latches the outputs of MUXs 910-912 on the falling edge of CK. When state machine 900 is used as logic block 820, the cycle time is limited by the delay through XOR 913, the select input to output delay of MUXs 910-912, and the setup time to latch 915.

Figure 10:
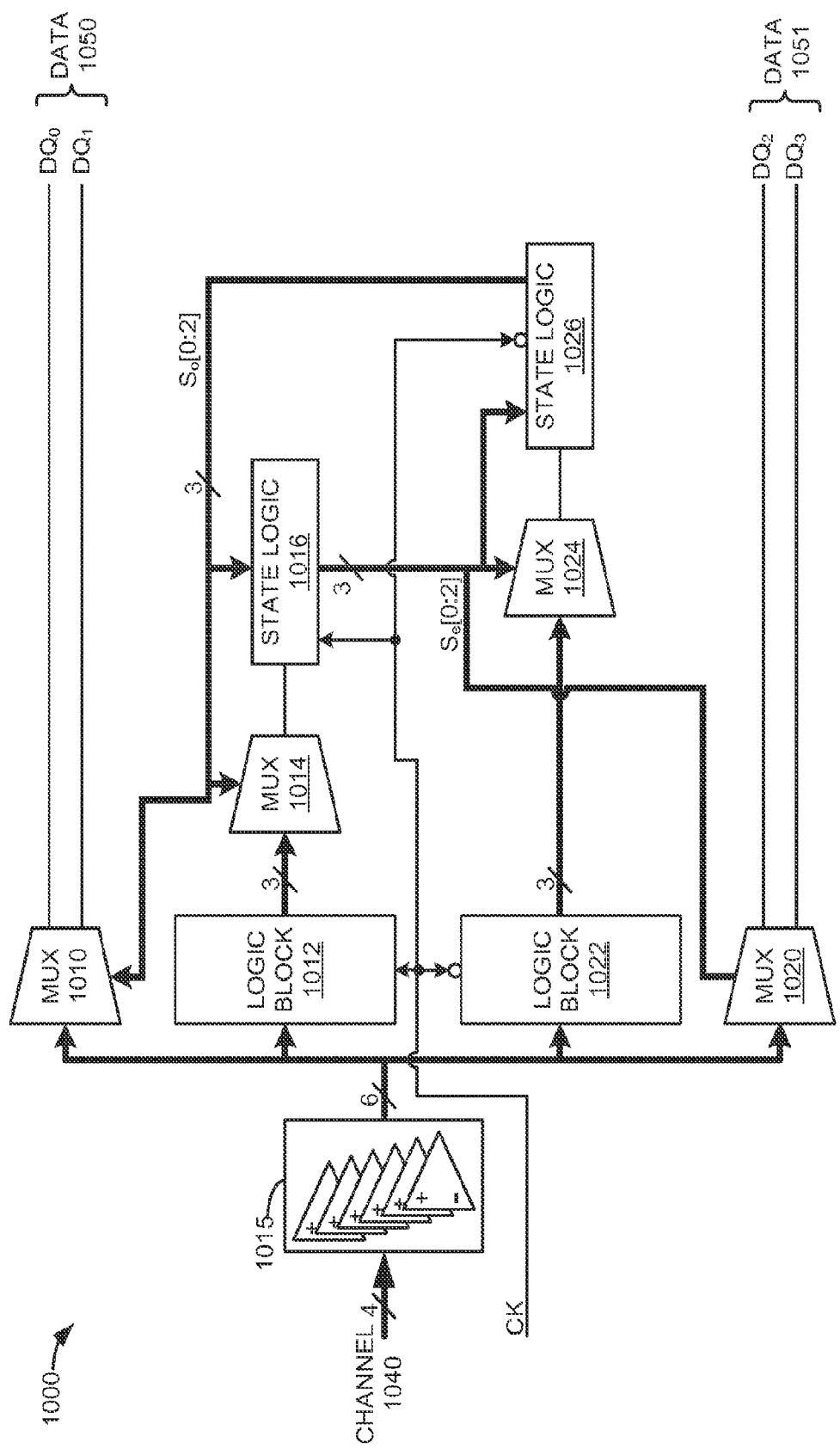
FIG. 10 is a block diagram illustrating double data rate decoder.

FIG. 10 is a block diagram illustrating double data rate decoder. Decoder 1000 comprises differential receivers 1015, 6:2 MUX 1010, 6:2 MUX 1020, logic block 1012, logic block 1022, 3:1 MUX 1014, 3:1 MUX 1024, state logic 1016, and state logic 1026. Logic block 1012, logic block 1022, and state logic 1016 and state logic 1026 may be clocked by clock signal CK. Logic block 1022, MUX 1024, and state logic 1026 determine the odd state vector $S_o[0:2]$. The odd state vector $S_o[0:2]$ determines which two outputs from differential receivers 1015 are to be output from decoder 1000 for the first phase (e.g., CK at a logic "1") as data 1050 ($DQ_0$ and $DQ_1$). Logic block 1012, MUX 1014, and state logic 1016 determine the even state vector $S_e[0:2]$. The even state vector $S_e[0:2]$ determines which two outputs from differential receivers 1015 are to be output from decoder 1000 for the second phase (e.g., CK at a logic "0") as data 1051 ($DQ_2$ and $DQ_3$).

In FIG. 10, channel 1040 is input to differential receivers 1015. Differential receivers 1015 may be clocked by the edges of a clock signal CK. Channel 1040 includes four links (e.g., a, b, c, and d) and uses a 2-4 encoding scheme. Thus, as descried previously, differential receivers 1015 output six comparisons between the four links (e.g., a-b, c-d, ... etc., such as shown in Table 5). These six outputs are input to the data inputs of a 6:2 MUX 1010. During a first phase of a clock signal CK, and based on the odd state vector $S_o[0:2]$ applied to the select inputs of MUX 1010, MUX 1010 selects two of the six inputs to output as decoded data 1050 ($DQ_0$ and $DQ_1$). Decoded data 1050 may be latched by a latch (not shown). During a second phase of the clock signal CK, and based on the even state vector $S_e[0:2]$ applied to the select inputs of MUX 1020, MUX 1020 selects two of the six inputs to output as decoded data 1051 ($DQ_2$ and $DQ_3$). Decoded data 1051 may be latched by a latch (not shown). In an embodiment, DQ1 and DQ3, or their equivalent, may be used by state logic 1016 and state logic 1026, respectively, to determine a rotation of the previous state vector to generate the next state vector.

Logic block 1012 receives the six outputs from differential receivers 1015. Logic block 1012 processes the six outputs to produce three output signals. These three output signals each correspond to one of the three possible values of the odd state vector $S_o[0:2]$. Each of the three signals output by logic block 1012 determines the direction the odd state vector $S_o[0:2]$ should be rotated to produce the next even state vector $S_e[0:2]$. The one of the three signals selected to determine the next even state vector $S_e[0:2]$ is based on the current value of the odd state vector $S_o[0:2]$. Thus, under the control of the current odd state vector $S_o[0:2]$, MUX 1014 selects one of the three signals output by logic block 1012 and inputs it to state logic 1016.

The logic function performed by logic block 1012 depends on the encoding scheme being decoded by decoder 1000. For example, if decoder 1000 is decoding the encoding scheme described in Table 6, the output from logic block 1012 corresponding to an odd state vector of state 0 may be the logic function (a-b) XOR (c-d); the output corresponding to state 1 may be logic function (a-d) XOR (b-c); and, the output corresponding to state 2 may be the logic function (b-d) XOR (c-a).

State logic 1016 receives the odd state vector $S_o[0:2]$ and the output from logic block 1012 selected by MUX 1014. Based on these inputs, state logic 1016 produces the next even state vector $S_e[0:2]$. For example, state logic 1016 may rotate the current odd state vector $S_o[0:2]$ in the direction indicated by the signal from MUX 1014. If the output of MUX 1014 is high, $S_o[0:2]$ is rotated right and output from state logic 1016 as $S_e[0:2]$. If the output of MUX 1014 is low, $S_o[0:2]$ is rotated left and output from state logic 1016 as $S_e[0:2]$.

Logic block 1022, MUX 1024, and state logic 1026 are connected and function in a similar manner as logic block 1012, MUX 1024, and state logic 1016, respectively, except that they operate with $S_e[0:2]$ as the input state and produce $S_o[0:2]$. In addition, state logic 1026 may include a latch to hold $S_o[0:2]$. As described previously, $S_o[0:2]$ controls the select inputs of MUX 1014. The output of MUX 1014 controls state logic 1016's operation on $S_o[0:2]$ to produce $S_e[0:2]$. $S_e[0:2]$ controls the select inputs of MUX 1024. The output of MUX 1024 controls state logic 1026's operation on $S_e[0:2]$ to produce $S_o[0:2]$. Thus, the cycle time for decoder 1000 to produce four data bits per clock cycle (i.e., two data bits per phase of CK) is limited by the delay from a change in $S_o[0:2]$ to the output of MUX 1014, plus the delay through state logic 1016 and MUX 1024, plus the delay through state logic 1026 including any setup and delay time from a latch internal to state logic 1026. This can also be summarized as follows: $T_{total} = T_{1014} + T_{1016} + T_{1024} + T_{1026}$.

Figure 11:
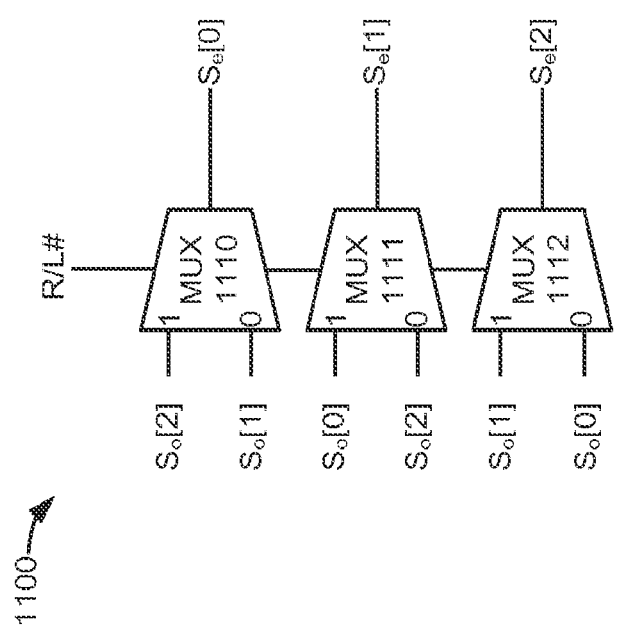
FIG. 11 is a diagram illustrating a state logic block suitable for use with the double data rate decoder of FIG. 10.

FIG. 11 is a diagram illustrating a state logic block suitable for use with the double data rate decoder of FIG. 10. In particular, state logic block 1100 shown in FIG. 11 is an example state logic block that is suitable for use as state logic block 1016 shown in FIG. 10.

State logic block 1100 performs a rotation of an input odd state vector $S_o[0:2]$ to produce an output even state vector $S_e[0:2]$. The direction of rotation is controlled by an input signal R/L#. R/L# would typically come from the output of MUX 1014 in FIG. 10.

State logic block 1100 comprises MUX 1110, MUX 1111, and MUX 1112. MUX 1110 has its "1" data input connected to $S_o[2]$ and its "0" input to $S_o[1]$. MUX 1111 has its "1" data input connected to $S_o[0]$ and its "0" input to $S_o[2]$. MUX 1112 has its "1" data input connected to $S_o[1]$ and its "0" input to $S_o[0]$. The output of MUX 1110 is $S_e[0]$. The output of MUX 1111 is $S_e[1]$. The output of MUX 1112 is $S_e[2]$. When state logic block 1100 is used as state logic block 1016, the delay $T_{1016}$ may be limited by the time from a change in the select input (R/L#) to the output of MUXs 1110-1112.

Figure 12:
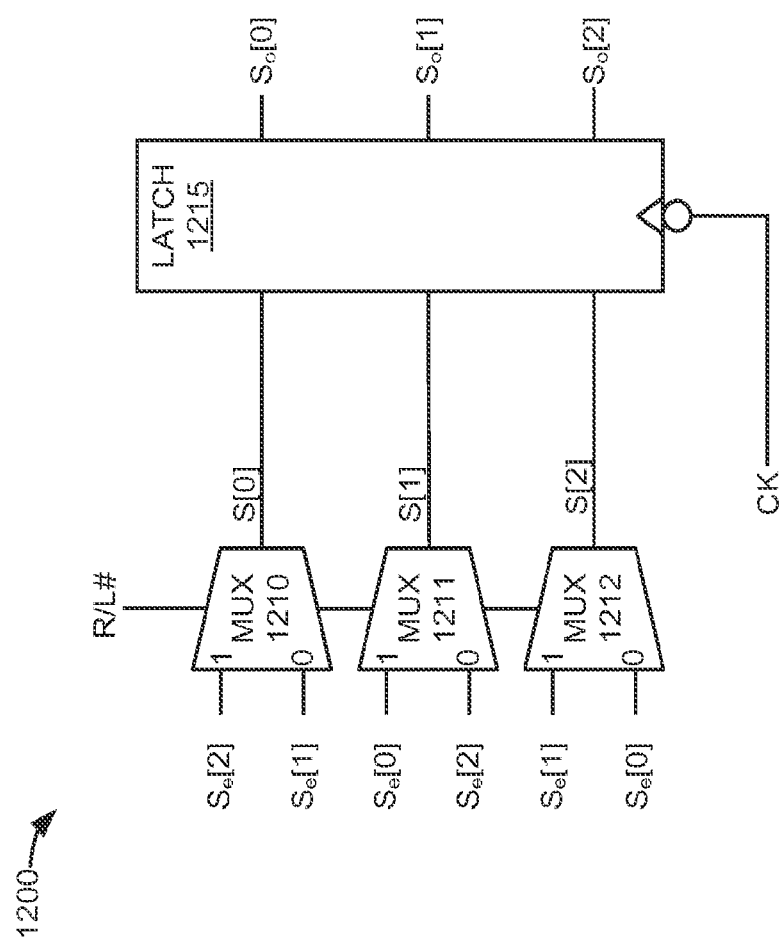
FIG. 12 is a diagram illustrating a state logic block with latched output suitable for use with the double data rate decoder of FIG. 10.

FIG. 12 is a diagram illustrating a state logic block with latched output suitable for use with the double data rate decoder of FIG. 10. In particular, state logic block 1200 shown in FIG. 12 is an example state logic block that is suitable for use as state logic block 1026 shown in FIG. 10.

State logic block 1200 performs a rotation of an input even state vector $S_e[0:2]$ to latch and produce an output odd state vector $S_o[0:2]$. The direction of rotation is controlled by an input signal R/L#. R/L# would typically come from the output of MUX 1024 in FIG. 10.

State logic block 1200 comprises MUX 1210, MUX 1211, MUX 1212 and 3-bit latch 1215. MUX 1210 has its "1" data input connected to $S_e[2]$ and its "0" input to $S_e[1]$. MUX 1211 has its "1" data input connected to $S_e[0]$ and its "0" input to $S_e[2]$. MUX 1212 has its "1" data input connected to $S_e[1]$ and its "0" input to $S_e[0]$. The output of MUX 1210 is S[0] which is latched and output by latch 1215 on the falling edge of CK as $S_o[0]$. The output of MUX 1211 is S[1] which is latched and output by latch 1215 on the falling edge of CK as $S_o[1]$. The output of MUX 1212 is S[2] which is latched and output by latch 1215 on the falling edge of CK as $S_o[2]$. When state logic block 1200 is used as state logic block 1026, the critical delay path $T_{1026}$ may be limited by the time from a change in the select input (R/L#) to the output of MUXs 1210-1212, plus the setup time required by latch 1215, plus the delay time from CK transitioning low to the change in $S_o[0:2]$.

When state logic block 1100 is used as state logic block 1016 and state logic block 1200 is used as state logic block 1026, the critical delay time $T_{total}$ is limited by 2*MUX delays (i.e., MUX 1014 and MUX 1016 data to output delay), 2 MUX select delays (i.e., MUX 1110-1112 and MUX 1210-1212 select to output delays), the setup time to latch 1215, and the clock to output delay of latch 1215. This critical delay time $T_{total}$ should be less than the cycle time of the clock signal CK.

Figure 13:
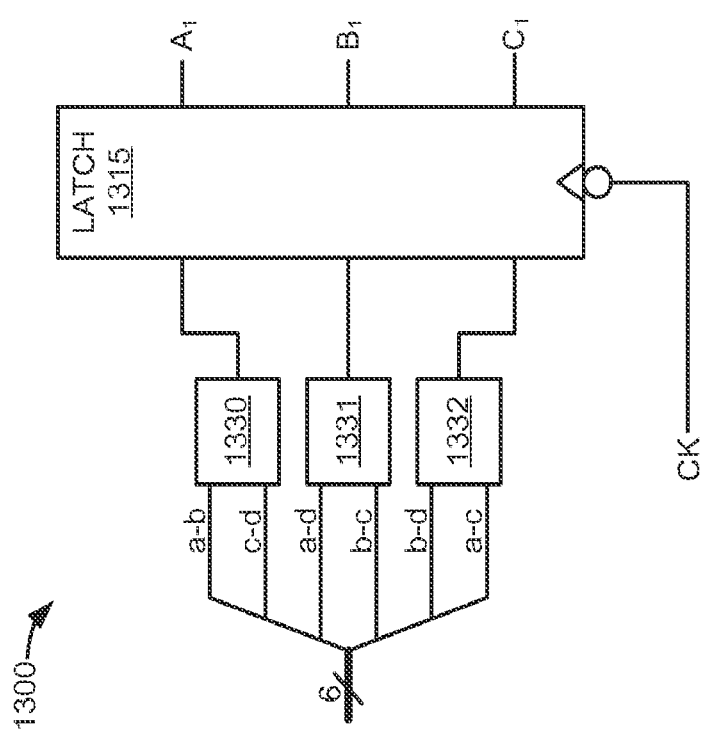
FIG. 13 is a diagram illustrating a logic block suitable for use with the double data rate decoder of FIG. 10.

FIG. 13 is a diagram illustrating a logic block suitable for use with the double data rate decoder of FIG. 10. In particular, logic block 1300 shown in FIG. 13 is an example logic block that is suitable for use as logic block 1012 shown in FIG. 10.

In FIG. 13, logic block 1300 comprises latch 1315, logic 1330, logic 1331, and logic 1332. Logic 1330 receives two inputs from differential receivers (e.g., differential receivers 1015) that correspond to a-b and c-d. Logic 1331 receives two inputs from differential receivers that correspond to a-d and b-c. Logic 1332 receives two inputs from differential receivers that correspond to b-d and a-c. The output of logic 1330 is latched by latch 1315 and output as signal $A_1$. The output of logic 1331 is latched by latch 1315 and output as signal $B_1$. The output of logic 1332 is latched by latch 1315 and output as signal $C_1$. $A_1$, $B_1$, and $C_1$ are latched on the falling edge of CK. In an example, $A_1$, $B_1$, and $C_1$ form the three outputs of logic block 1012 which are input to the data inputs of MUX 1014.

The logic functions of logic 1330-1332 depends on the encoding being decoded. For example, logic 1330 and 1331 may be 2 input XOR gates and logic 1332 may be a 2 input XNOR gate. In other words, $A_1$=(a-b) XOR (c-d); $B_1$=(a-d) XOR (b-c); and, $C_1$=(b-d) XNOR (a-c). This is suitable to decode the encoding described in Table 5. In another example, logic 1332 may include a 2 input XOR gate.

Figure 14:
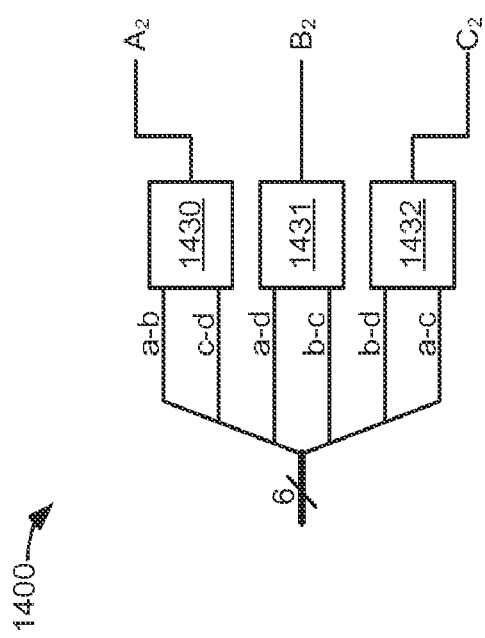
FIG. 14 is a diagram illustrating a logic block suitable for use with the double data rate decoder of FIG. 10.

FIG. 14 is a diagram illustrating a logic block suitable for use with the double data rate decoder of FIG. 10. In particular, logic block 1400 shown in FIG. 14 is an example logic block that is suitable for use as logic block 1022 shown in FIG. 10.

In FIG. 14, logic block 1400 comprises logic 1430, logic 1431, and logic 1432. Logic 1430 receives two inputs from differential receivers (e.g., differential receivers 1015) that correspond to a-b and c-d. Logic 1431 receives two inputs from differential receivers that correspond to a-d and b-c. Logic 1432 receives two inputs from differential receivers that correspond to b-d and a-c. The output of logic 1430 is signal $A_2$. The output of logic 1431 signal $B_2$. The output of logic 1432 is signal $C_1$. In an example, $A_2$, $B_2$, and $C_2$ form the three outputs of logic block 1022 which are input to the data inputs of MUX 1024.

It should be understood that logic block 1400 is similar to logic block 1300 without latch 1315. Thus, the logic 1430-1432 may perform similar (or the same) logic functions as logic 1330-1332, respectively. Accordingly, a discussion of logic functions 1430-1432 will be omitted for the sake of brevity.

Figure 15:
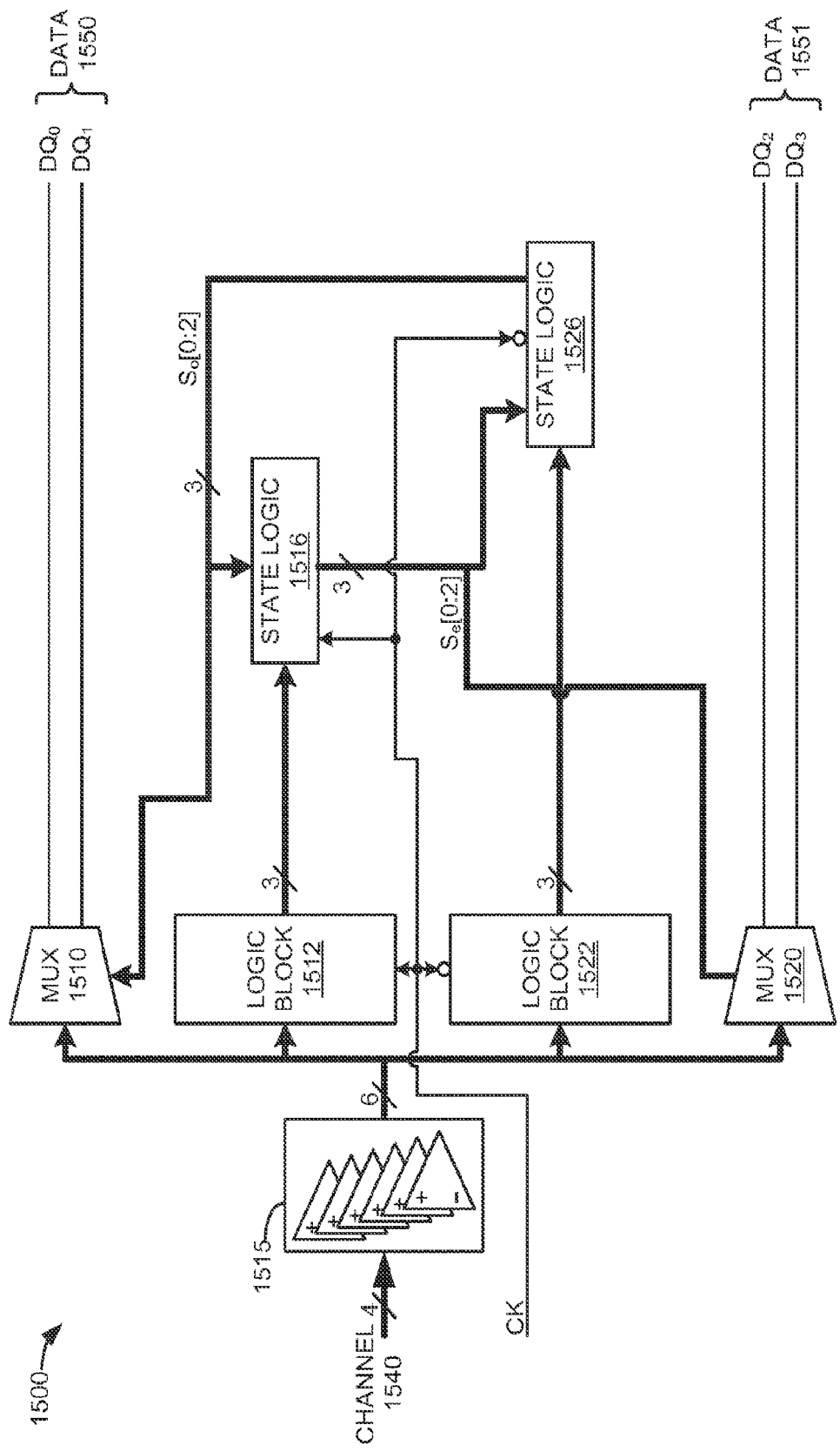
FIG. 15 is a block diagram illustrating double data rate decoder.

FIG. 15 is a block diagram illustrating double data rate decoder. Decoder 1500 comprises differential receivers 1515, 6:2 MUX 1510, 6:2 MUX 1520, logic block 1512, logic block 1522, state logic 1516, and state logic 1526. Logic block 1512, logic block 1522, and state logic 1516 and state logic 1526 may be clocked by clock signal CK. Logic block 1522 and state logic 1526 determine the odd state vector $S_o[0:2]$. The odd state vector $S_o[0:2]$ determines which two outputs from differential receivers 1515 are to be output from decoder 1500 for the first phase (e.g., CK at a logic "1") as data 1550 ($DQ_0$ and $DQ_1$). Logic block 1512 state logic 1516 determine the even state vector $S_e[0:2]$. The even state vector $S_e[0:2]$ determines which two outputs from differential receivers 1515 are to be output from decoder 1500 for the second phase (e.g., CK at a logic "0") as data 1051 ($DQ_2$ and $DQ_3$). Thus, decoder 1500 is similar to decoder 1000 without MUXs 1014 and 1024. Therefore, the delays from the select inputs of MUXs 1014 and 1024 are not in the critical delay time $T_{total}$ for decoder 1500.

In FIG. 15, channel 1540 is input to differential receivers 1515. Differential receivers 1515 are optionally clocked by the edges or states of a clock signal CK. Channel 1540 includes the four links a, b, c, and d encoded using a 2-4 encoding scheme. Thus, as descried previously, differential receivers 1515 output six comparisons between the four links (e.g., a-b, c-d, . . . etc., such as shown in Table 5 or Table 6). These six comparison outputs are input to the data inputs of a 6:2 MUX 1510. During a first phase of a clock signal CK, and based on the odd state vector $S_o[0:2]$ applied to the select inputs of MUX 1510, MUX 1510 selects two of the six inputs to output as decoded data 1550 ($DQ_0$ and $DQ_1$). Decoded data 1550 may be latched by a latch (not shown). During a second phase of the clock signal CK, and based on the even state vector $S_e[0:2]$ applied to the select inputs of MUX 1520, MUX 1520 selects two of the six inputs to output as decoded data 1051 ($DQ_2$ and $DQ_3$). Decoded data 1551 may be latched by a latch (not shown).

Logic block 1512 receives the six outputs from differential receivers 1515. Logic block 1512 processes the six outputs to produce three output signals (e.g., $A_1$, $B_1$, and $C_1$). These three output signals are input to state logic 1516. As with decoder 1000, the logic function performed by logic block 1512 depends on the encoding scheme being decoded by decoder 1500.

State logic 1516 receives the odd state vector $S_o[0:2]$ and the output from logic block 1512. Based on these inputs, state logic 1516 produces the next even state vector $S_e[0:2]$. For example, state logic 1016 may select a logic function based on one or more of the three input signal based on the current odd state vector $S_o[0:2]$.

Logic block 1522 and state logic 1526 are connected and function in a similar manner as logic block 1512 state logic 1516, respectively, except that they operate with $S_e[0:2]$ as the input state and produce $S_o[0:2]$. In addition, state logic 1526 may include a latch to hold $S_o[0:2]$. As described previously, $S_o[0:2]$ controls the inputs to state logic 1516 which produces $S_e[0:2]$. $S_e[0:2]$ controls the inputs to state logic 1526 which operates on $S_e[0:2]$ to produce $S_o[0:2]$. Thus, the cycle time for decoder 1500 to produce four data bits per clock cycle (i.e., two data bits per phase) is limited by the delay from a change in $S_o[0:2]$ to the output of state logic 1516, plus the delay through state logic 1526 including any setup and delay time from a latch internal to state logic 1526. This can also be summarized as follows: $T_{total} = T_{1516} + T_{1526}$.

Figure 16:
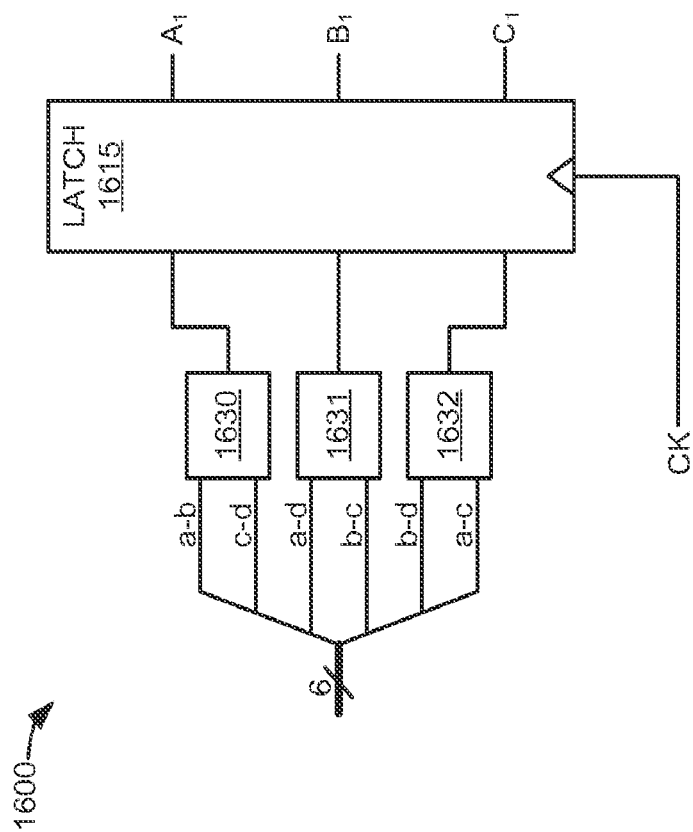
FIG. 16 is a diagram illustrating a logic block suitable for use with the double data rate decoder of FIG. 15.

FIG. 16 is a diagram illustrating a logic block suitable for use with the double data rate decoder of FIG. 15. In particular, logic block 1600 shown in FIG. 16 is an example logic block that is suitable for use as logic block 1512 shown in FIG. 15.

In FIG. 16, logic block 1600 comprises latch 1615, logic 1630, logic 1631, and logic 1632. Logic 1630-1633 are connected and function like logic 1330-1332 of FIG. 13. However, latch 1615 latches the outputs of logic 1630-1633 on the rising edge of CK to produce $A_1$, $B_1$, and $C_1$. This should be contrasted with latch 1315 of FIG. 13 that latches on the falling edge of CK. $A_1$, $B_1$, and $C_1$ form three outputs of logic block 1512 which are input to state logic 1516.

Figure 17:
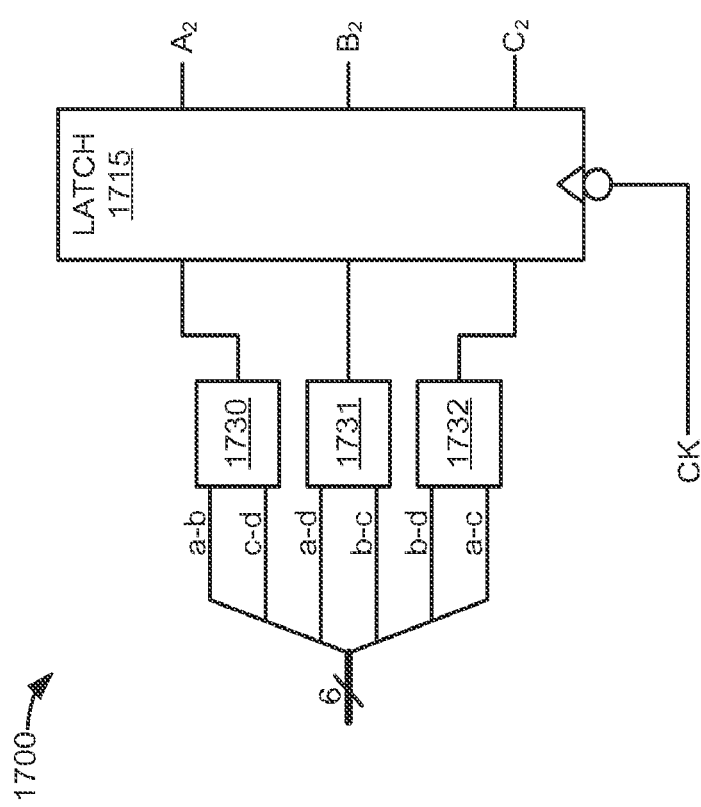
FIG. 17 is a diagram illustrating a logic block suitable for use with the double data rate decoder of FIG. 15.

FIG. 17 is a diagram illustrating a logic block suitable for use with the double data rate decoder of FIG. 15. In particular, logic block 1700 shown in FIG. 17 is an example logic block that is suitable for use as logic block 1522 shown in FIG. 15.

In FIG. 17, logic block 1700 comprises latch 1715, logic 1730, logic 1731, and logic 1732. Logic 1730-1732 are connected and function like logic 1630-1632 of FIG. 13. However, latch 1715 latches the outputs of logic 1730-1733 on the falling edge of CK to produce $A_2$, $B_2$, and $C_2$.

Figure 18:
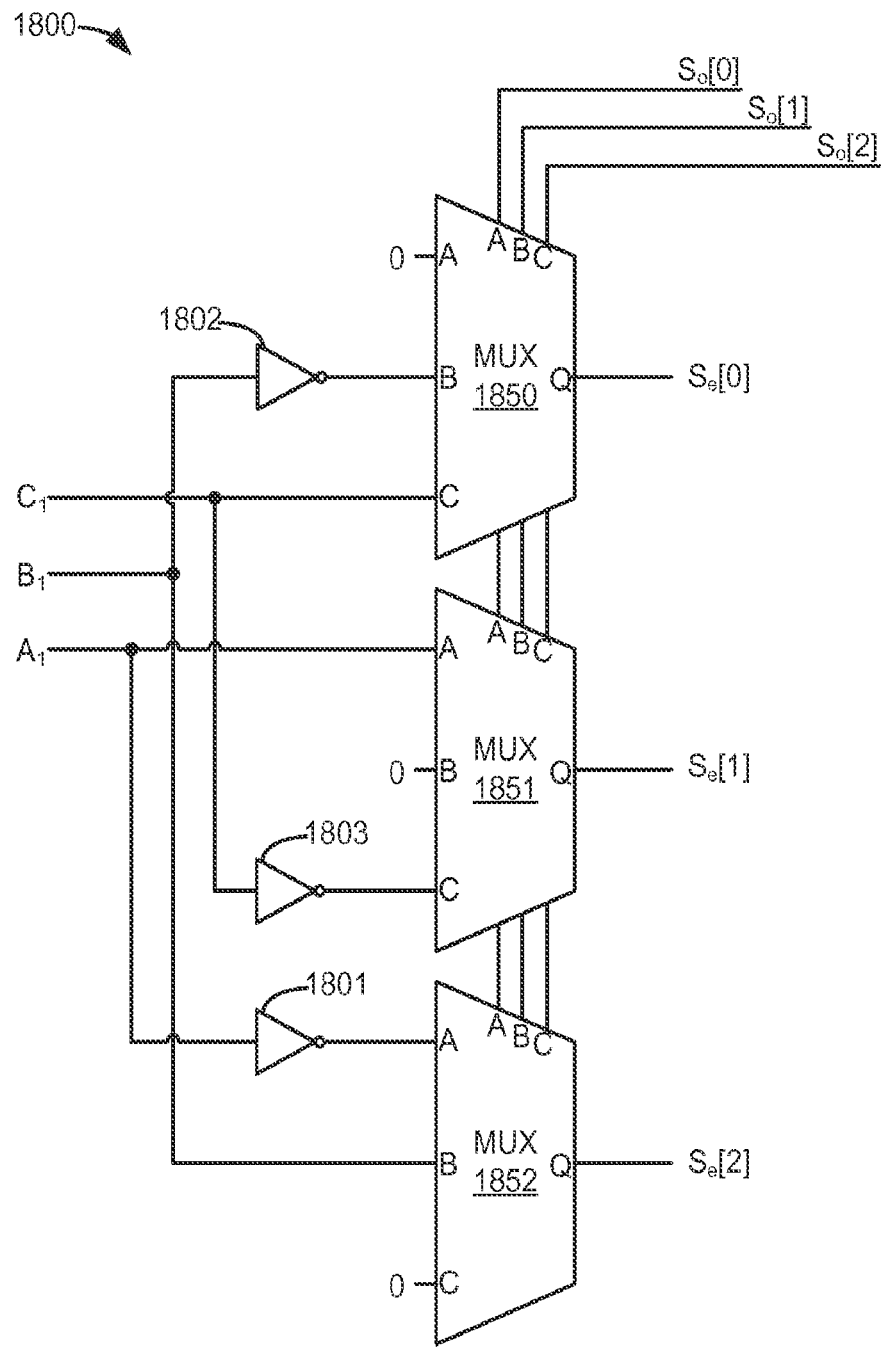
FIG. 18 is a diagram illustrating a state logic block suitable for use with the double data rate decoder of FIG. 15.

FIG. 18 is a diagram illustrating a state logic block suitable for use with the double data rate decoder of FIG. 15. In particular, state logic block 1800 shown in FIG. 18 is an example logic block that is suitable for use as state logic block 1516 shown in FIG. 15.

In FIG. 18, state logic block 1800 comprises inverter 1801, inverter 1802, inverter 1803, 3:1 MUX 1850, 3:1 MUX 1851, and 3:1 MUX 1852. The "A" select input of MUXs 1850-1851 are connected to $S_o[0]$. The "B" select input of MUXs 1850-1851 are connected to $S_o[1]$. The "C" select input of MUXs 1850-1851 are connected to $S_o[2]$. Thus, if $S_o[0:2]$ is indicating it is state 0, then MUXs 1850-1851 all select their "A" input; if $S_o[0:2]$ is indicating it is state 1, then MUXs 1850-1851 all select their "B" input, and so on.

$A_1$ is connected to the A input of MUX 1851 and the input of inverter 1801. The output of inverter 1801 is input to the A input of MUX 1852. $B_1$ is connected to the B input of MUX 1852 and the input of inverter 1802. The output of inverter 1802 is input to the B input of MUX 1850. $C_1$ is connected to the C input of MUX 1850 and the input of inverter 1803. The output of inverter 1803 is input to the C input of MUX 1851.

A constant zero "0" is input to the A input of MUX 1850, the B input of MUX 1851, and the C input of MUX 1852. The output of MUXs 1850-1852 are $S_e[0:2]$, respectively.

It should be understood that state logic block 1800 performs a rotation on the odd input vector $S_o[0:2]$ to determine the next even state vector $S_e[0:2]$. The direction of this rotation is determined by the state of the corresponding input $A_1$, $B_1$, or $C_1$. $A_1$ determines the direction $S_o[0:2]$ is rotated when $S_o[0:2]$ indicates a state of state 0. $B_1$ determines the direction $S_o[0:2]$ is rotated when $S_o[0:2]$ indicates a state of state 1. $C_1$ determines the direction $S_o[0:2]$ is rotated when $S_o[0:2]$ indicates a state of state 2.

Figure 19:
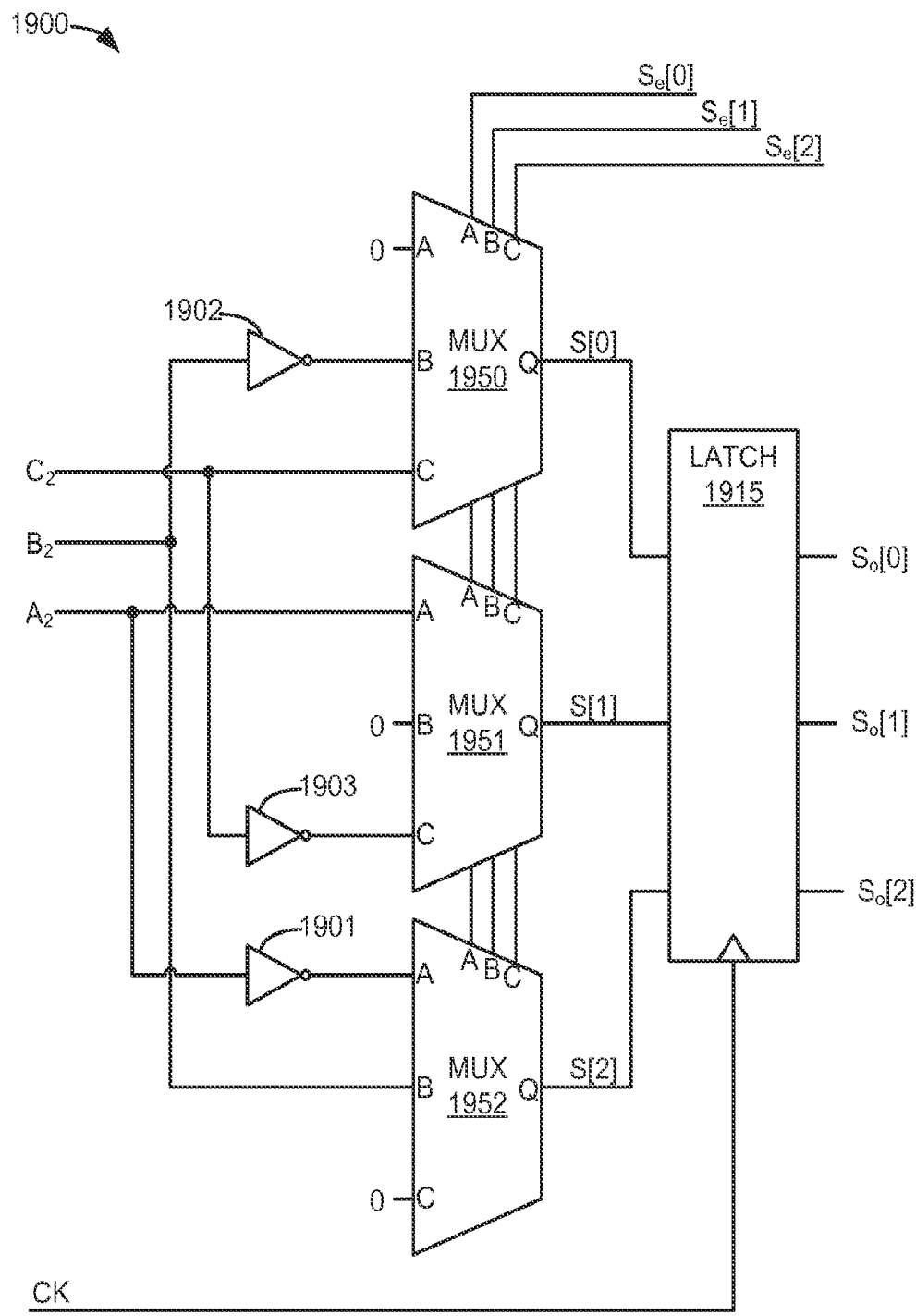
FIG. 19 is a diagram illustrating a state logic block with latched output suitable for use with the double data rate decoder of FIG. 15.

FIG. 19 is a diagram illustrating a state logic block suitable for use with the double data rate decoder of FIG. 15. In particular, state logic block 1900 shown in FIG. 19 is an example logic block that is suitable for use as state logic block 1526 shown in FIG. 15.

In FIG. 19, state logic block 1900 comprises inverter 1901, inverter 1902, inverter 1903, 3:1 MUX 1950, 3:1 MUX 1951, and 3:1 MUX 1952. The "A" select input of MUXs 1950-1951 are connected to $S_e[0]$. The "B" select input of MUXs 1950-1951 are connected to $S_e[1]$. The "C" select input of MUXs 1950-1951 are connected to $S_e[2]$. Thus, if $S_e[0:2]$ is indicating it is state 0, then MUXs 1950-1951 all select their "A" input; if $S_e[0:2]$ is indicating it is state 1, then MUXs 1950-1951 all select their "B" input, and so on.

Inputs $A_2$, $B_2$, and $C_2$ and MUXs 1950-1952 are connected like inputs $A_1$, $B_1$, and $C_1$ and MUXs 1950-1952 of FIG. 18. Thus, it should be understood that state logic block 1900 performs a rotation on the even input vector $S_e[0:2]$ to determine and then latch, by latch 1915, the next odd state $S_o[0:2]$. The direction of this rotation is determined by the state of the corresponding input $A_2$, $B_2$, or $C_2$. Similar to state logic block 1800, $A_2$ determines the direction $S_e[0:2]$ is rotated when $S_e[0:2]$ indicates a state of state 0, and so on.

When state logic block 1800 is used as state logic block 1516, and state logic block 1900 is used as state logic block 1526, the critical delay time $T_{total}$ is limited by 2 MUX select delays (i.e., MUX 1850-1852 and MUX 1950-1952 select to output delays), the setup time to latch 1915, and the clock to output delay of latch 1915. This critical delay time $T_{total}$ should be less than the cycle time of the clock signal CK.

Figure 20:
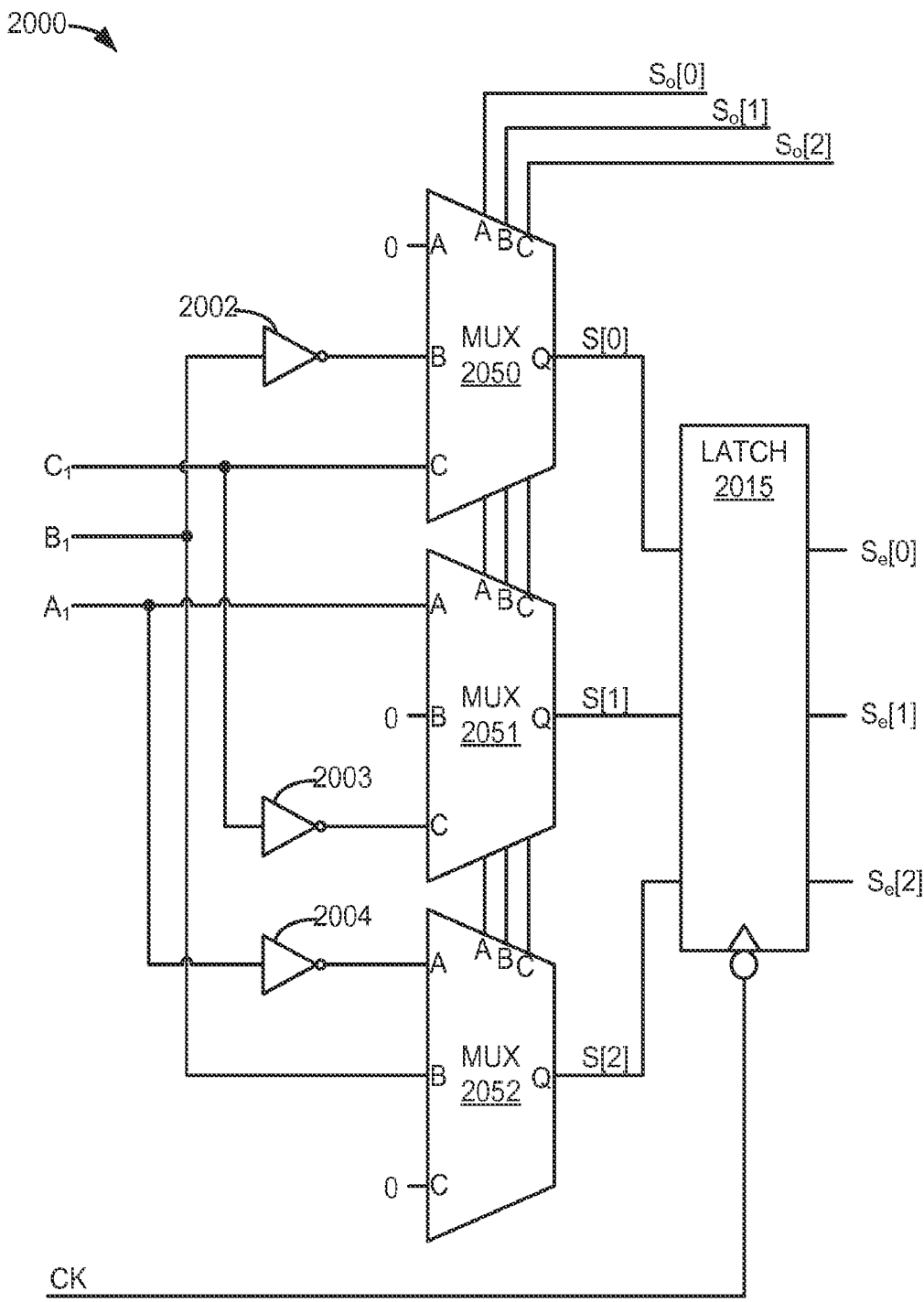
FIG. 20 is a diagram illustrating a state logic block with latched output suitable for use with the double data rate decoder of FIG. 15.

FIG. 20 is a diagram illustrating a state logic block with latched output suitable for use with the double data rate decoder of FIG. 15. In particular, state logic block 2000 shown in FIG. 20 is an example state logic block that is suitable for use as state logic block 1516 shown in FIG. 15. State logic block 2000 is connected and performs the same function as state logic block 1800, except that the outputs of MUXs 2050-2052 (which correspond to MUXs 1850-1852 of FIG. 18) are latched by latch 2015 on the falling edge of the clock signal CK. The output of latch 2015 is the even state vector $S_e[0:2]$.

Figure 21:
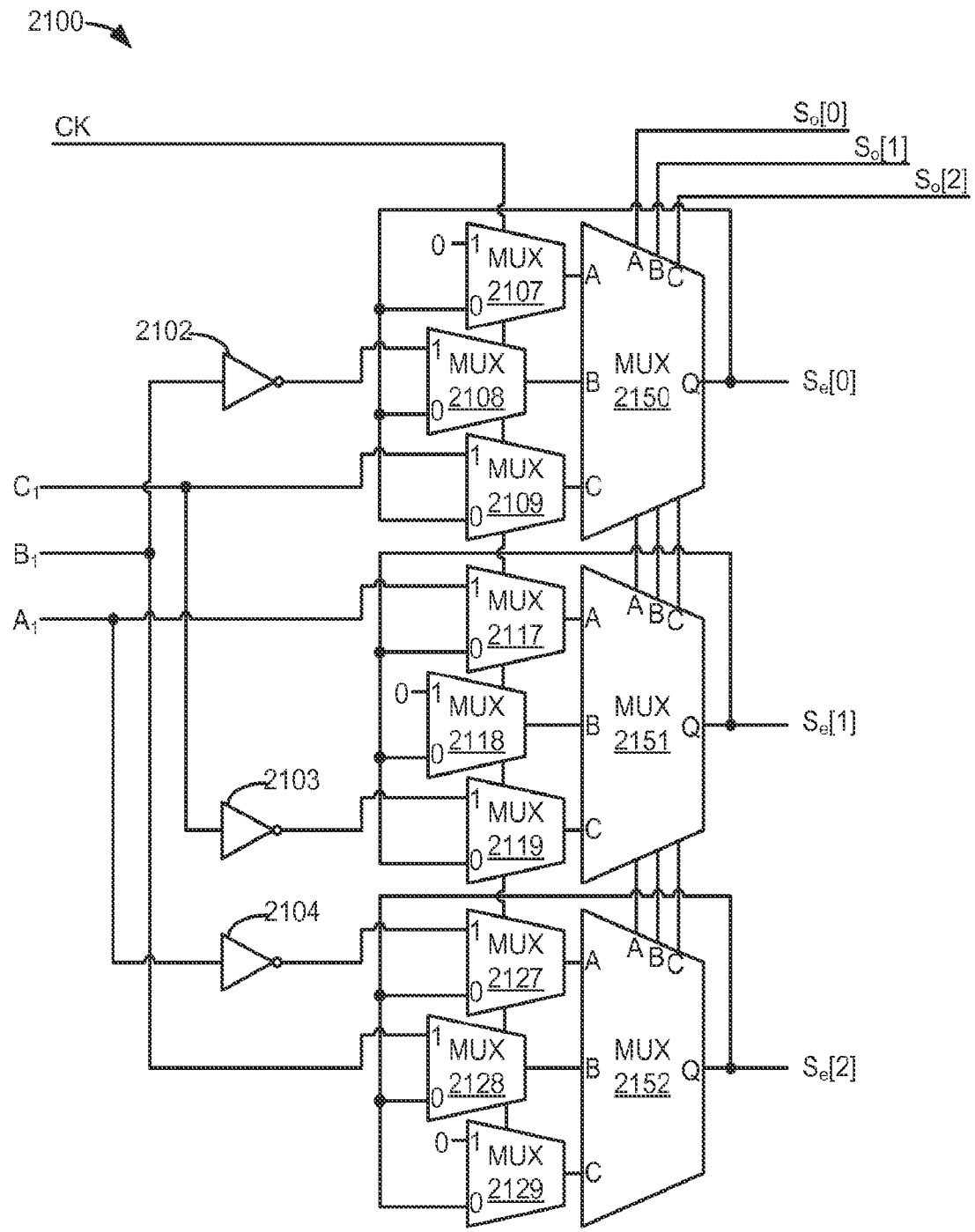
FIG. 21 is a diagram illustrating a state logic block with latched output suitable for use with the double data rate decoder of FIG. 15.

FIG. 21 is a diagram illustrating a state logic block with latched output suitable for use with the double data rate decoder of FIG. 15. State logic block 2100 is an example state logic block that is suitable for use as state logic block 1516 shown in FIG. 15.

In FIG. 21, state logic block 2100 comprises inverter 2102, inverter 2103, inverter 2104, 2:1 MUX 2107, 2:1 MUX 2108, 2:1 MUX 2109, 2:1 MUX 2117, 2:1 MUX 2118, 2:1 MUX 2119, 2:1 MUX 2127, 2:1 MUX 2128, 2:1 MUX 2129, 3:1 MUX 2150, 3:1 MUX 2151, and 3:1 MUX 2152. The select input of MUXs 2107-2109, 2117-2119, and 2127-2129 are connected to the clock signal CK. The "A" select input of MUXs 2150-2151 are connected to $S_o[0]$. The "B" select input of MUXs 2150-2151 are connected to $S_o[1]$. The "C"

select input of MUXs 2150-2151 are connected to $S_o[2]$. Thus, if $S_o[0:2]$ is indicating it is state 0, then MUXs 2150-2151 all select their "A" input; if $S_o[0:2]$ is indicating it is state 1, then MUXs 2150-2151 all select their "B" input, and so on.

$A_1$ is connected to the "1" data input of MUX 2117 and the input of inverter 2104. The output of inverter 2104 is input to the "1" input of MUX 2117. $B_1$ is connected to the "1" input of MUX 2118 and the input of inverter 2102. The output of inverter 2102 is input to the "1" input of MUX 2108. $C_1$ is connected to the "1" input of MUX 2109 and the input of inverter 2103. The output of inverter 2103 is input to the "1" input of MUX 2119. A constant zero "0" is input to the "1" input of MUXs 2107, 2118, and 2129.

The output of MUXs 2150-2152 are $S_e[0:2]$, respectively. $S_e[0]$ is connected to the "0" input of MUXs 2107-2109. $S_e[1]$ is connected to the "0" input of MUX 2117-2119. $S_e[2]$ is connected to the "0" input of MUXs 2127-2129. The outputs of MUXs 2107-2109 are connected to the A, B, and C inputs of MUX 2150, respectively. The outputs of MUXs 2117-2119 are connected to the A, B, and C inputs of MUX 2151, respectively. The outputs of MUXs 2127-2129 are connected to the A, B, and C inputs of MUX 2152, respectively.

When CK is high, state logic block 2100 performs a rotation on the odd input vector $S_o[0:2]$ to determine the next even state $S_e[0:2]$. The direction of this rotation is determined by the state of the corresponding input $A_1$, $B_1$, or $C_1$. $A_1$ determines the direction $S_o[0:2]$ is rotated when $S_o[0:2]$ indicates a state of state 0. $B_1$ determines the direction $S_o[0:2]$ is rotated when $S_o[0:2]$ indicates a state of state 1. $C_1$ determines the direction $S_o[0:2]$ is rotated when $S_o[0:2]$ indicates a state of state 2.

When CK is low, because the "0" inputs of MUXs 2107-2109 are all connected to the output of MUX 2150, and all three inputs of MUX 2150 come from MUXs 2107-2109, the output of MUX 2150 is the same as all of its inputs. This forms a latch structure to hold the value of $S_e[0]$ when CK is low. This is also the case for $S_e[1]$ and $S_e[2]$. Thus, state logic block 2100 latches its output $S_e[0:2]$ when the clock is low.

Figure 22:
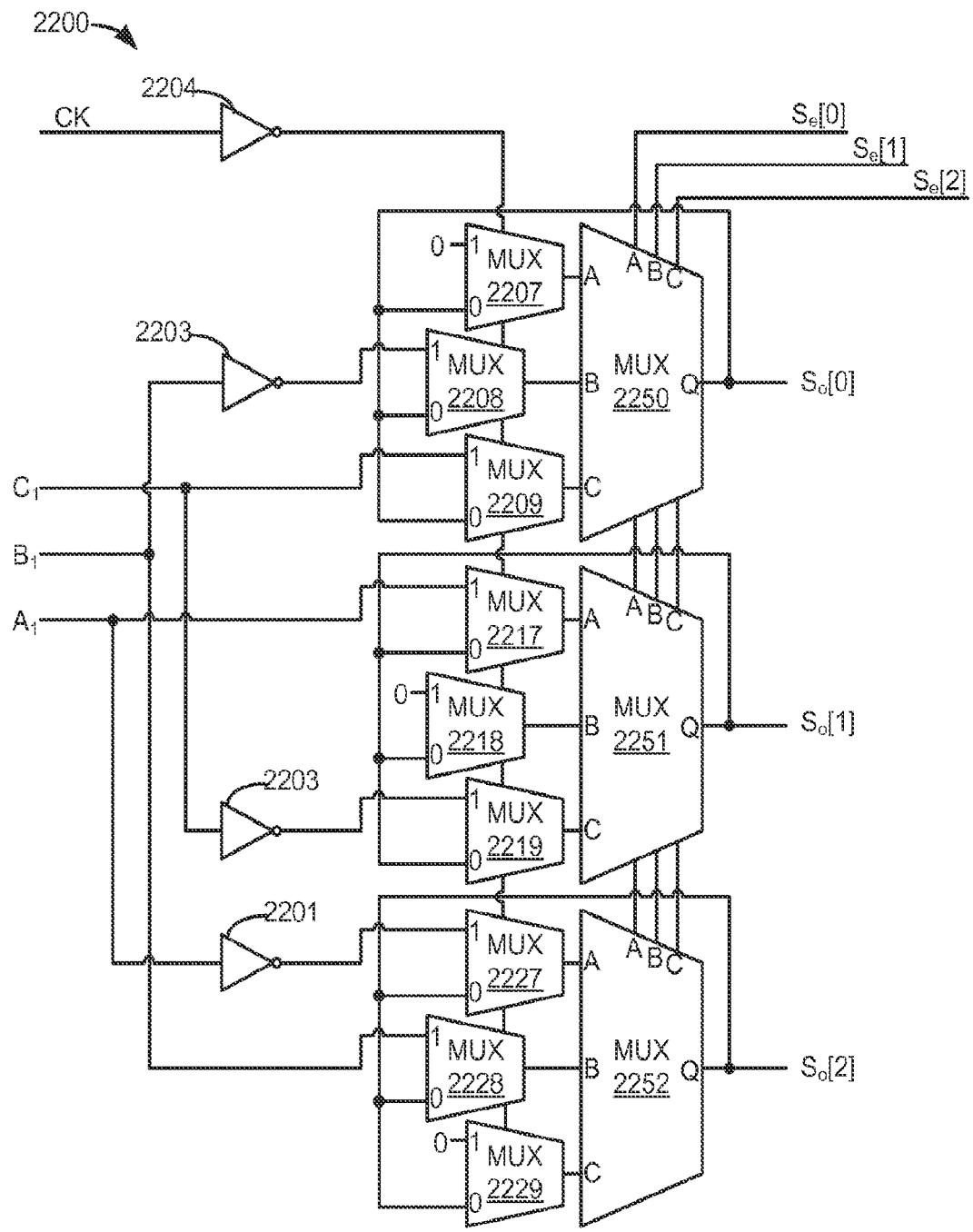
FIG. 22 is a diagram illustrating a state logic block with latched output suitable for use with the double data rate decoder of FIG. 15.

FIG. 22 is a diagram illustrating a state logic block with latched output suitable for use with the double data rate decoder of FIG. 15. In particular, state logic block 2200 shown in FIG. 22 is an example state logic block that is suitable for use as state logic block 1526 shown in FIG. 15. State logic block 2200 is connected and performs the same function as state logic block 2100, except that the outputs of MUXs 2250-2252 (which correspond to MUXs 2150-2152 of FIG. 21) are latched when the clock signal CK is high. The output of state logic block 2200 is the odd state vector $S_o[0:2]$.

When state logic block 2100 is used as state logic block 1516 and state logic block 2200 is used as state logic block 1526, the critical delay time ($T_{total} = T_{2100} + T_{2200} = T_{2150} + T_{2250}$) is limited by 2 MUX select delays (i.e., MUX 2150-2152 and MUX 2250-2252 select to output delays). Not that the setup and output delay of a latch is not part of this critical delay time. This critical delay time $T_{total}$ should be less than the cycle time of the clock signal CK.

Figure 23:
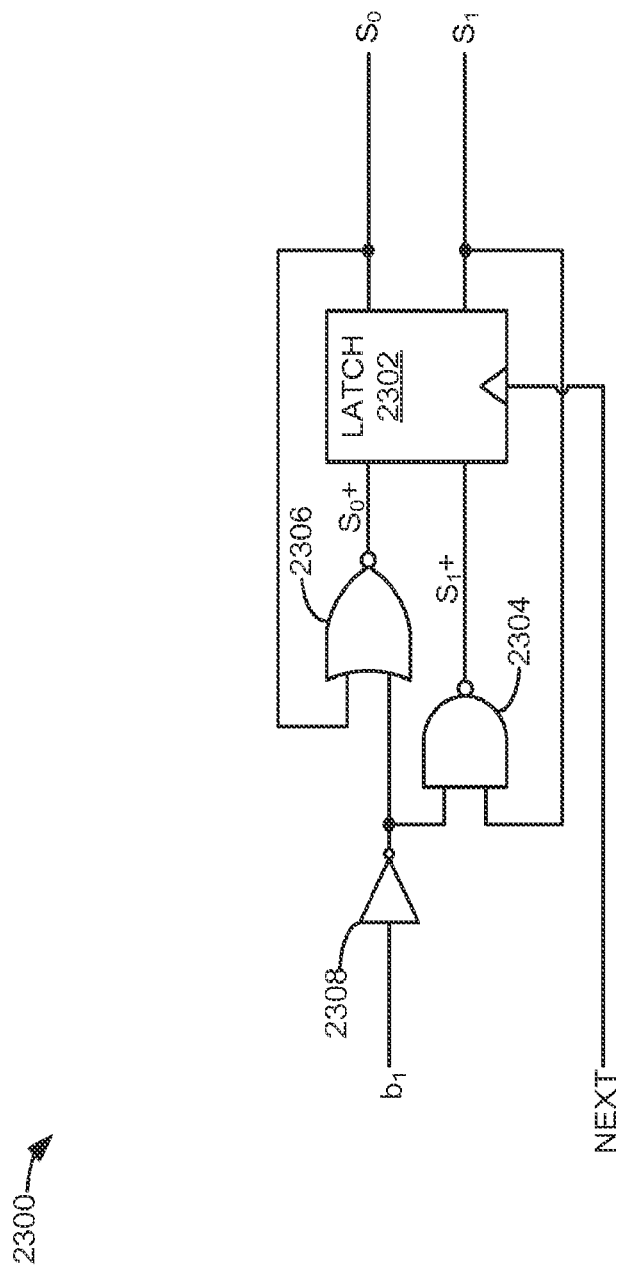
FIG. 23 is a diagram illustrating a logic implementation of a state machine.

FIG. 23 is a diagram illustrating a logic implementation of a state machine. The logic illustrated in FIG. 23 implements the state machine shown in FIG. 7D. As illustrated in FIG. 23, the inputs to the state machine 2300 illustrated in FIG. 23 are a data bit to be sent ($b_1$), and a clock signal (NEXT). The signal NEXT advances the state machine 2300 from state to state. The outputs of state machine 2300 are the bits $S[0:1] = S_0 S_1$ which define the state as shown in FIG. 7D (and Tables 7-8).

State machine 2300 comprises 2-bit latch 2302, 2-input NAND gate 2304, 2-input NOR gate 2306, and inverter 2308. A clock input of latch 2302 is clocked by the signal NEXT to advance state machine 2300. A first output of a latch 2302 is state bit $S_0$. A second output of a latch 2302 is state bit $S_1$.

Inverter 2308 receives data bit $b_1$. The output of inverter 2308 is connected to a first input of NAND gate 2304 and a first input of NOR gate 2306. The second input of NOR gate 2306 is connected to state bit $S_0$. The output of NOR gate 2306 is $S_0+$. $S_0+$ is connected to the input of latch 2302 that corresponds to $S_0$. The second input of NAND gate 2304 is connected to state bit $S_1$. The output of NAND gate 2304 is $S_1+$. $S_1+$ is connected to the input of latch 2302 that corresponds to $S_1$.

Figure 24:
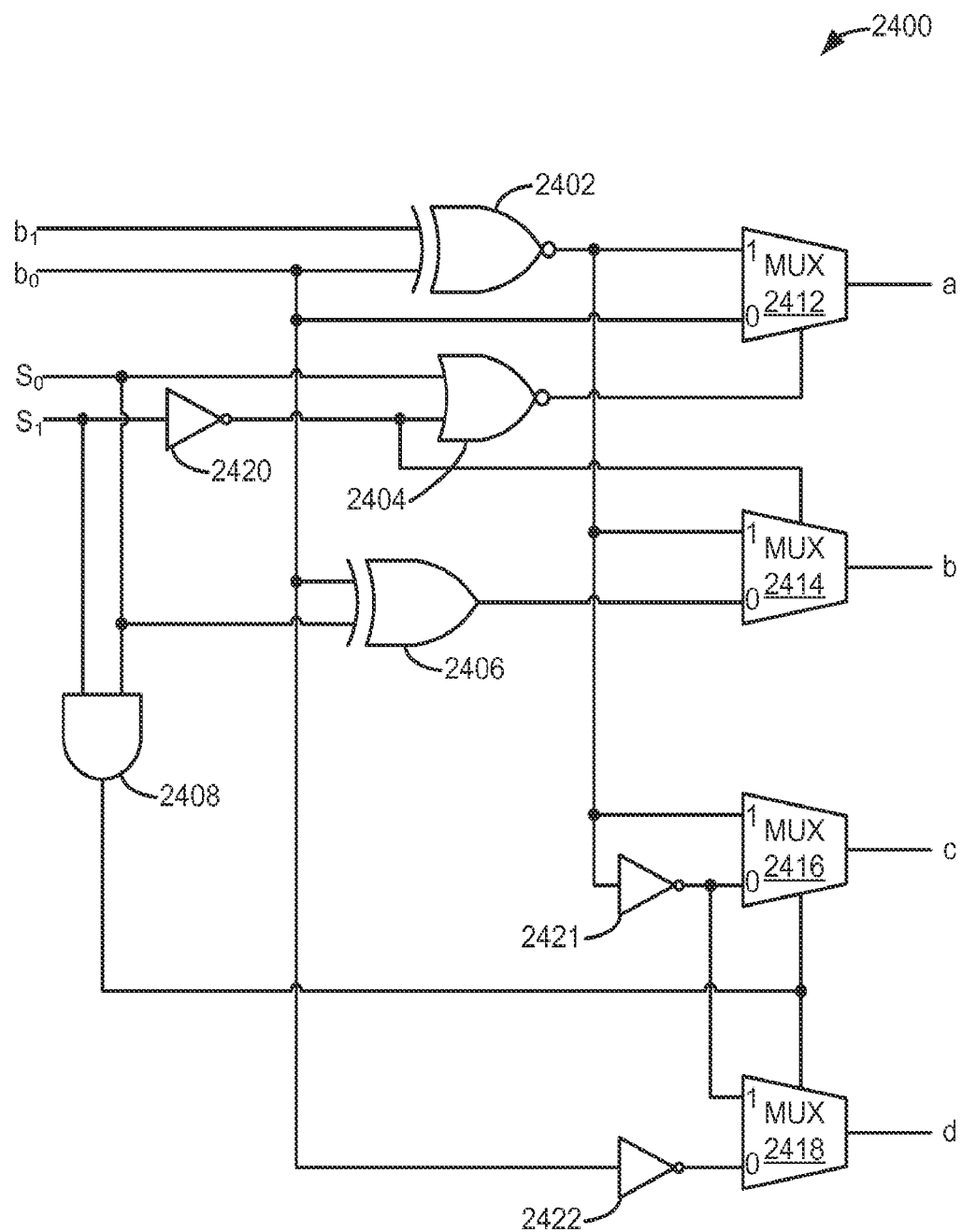
FIG. 24 is a diagram illustrating a logic implementation of an encoder.

FIG. 24 is a diagram illustrating a logic implementation of an encoder. The logic illustrated in FIG. 24 implements the encodings given in Tables 6-8. As illustrated in FIG. 24, the inputs to encoder 2400 are data bits $b_0 b_1$ and state bits $S_0 S_1$. In an embodiment, $S_0 S_1$ may be received from state machine 2300. The outputs of encoder 2400 are a, b, c, and d which correspond to the bits of the codeword as given in Tables 5 and 6.

Encoder 2400 comprises: 2-input XNOR gate 2402; 2-input NOR gate 2404; 2-input XOR gate 2406; AND gate 2408; 2-input MUXs 2412, 2414, 2416 and 2418; and inverters 2420, 2421, and 2422. Data bit $b_1$ is connected to a first input of NOR gate 2402. Data bit $b_0$ is connected to the second input of NOR gate 2402, a first input of XOR gate 2406, the input of inverter 2422, and the "0" input of MUX 2412 State bit $S_0$ is connected to a first input of NOR gate 2404, a first input of AND gate 2408, and the second input of XOR gate 2406. State bit $S_1$ is connected to the input of inverter 2420 and the second input of AND gate 2408.

The output of XNOR gate 2402 is connected to the "1" input of MUX 2412, the "1" input of MUX 2414, the "1" input of MUX 2416, and the input of inverter 2421. The output of NOR gate 2404 is connected to the control input of MUX 2412. The output of XOR gate 2406 is connected to the "0" input of MUX 2414. The output of AND gate 2408 is connected to the control input of MUX 2416 and the control input of MUX 2418. The output of inverter 2420 is connected to the second input of NOR gate 2404 and the control input of MUX 2414. The output of inverter 2421 is connected to the "0" input of MUX 2416 and the "1" input of MUX 2418. The output of inverter 2422 is connected to the "0" input of MUX 2418. The outputs of MUXs 2412-2418 are codeword bits a, b, c, and d, respectively.

Figure 25:
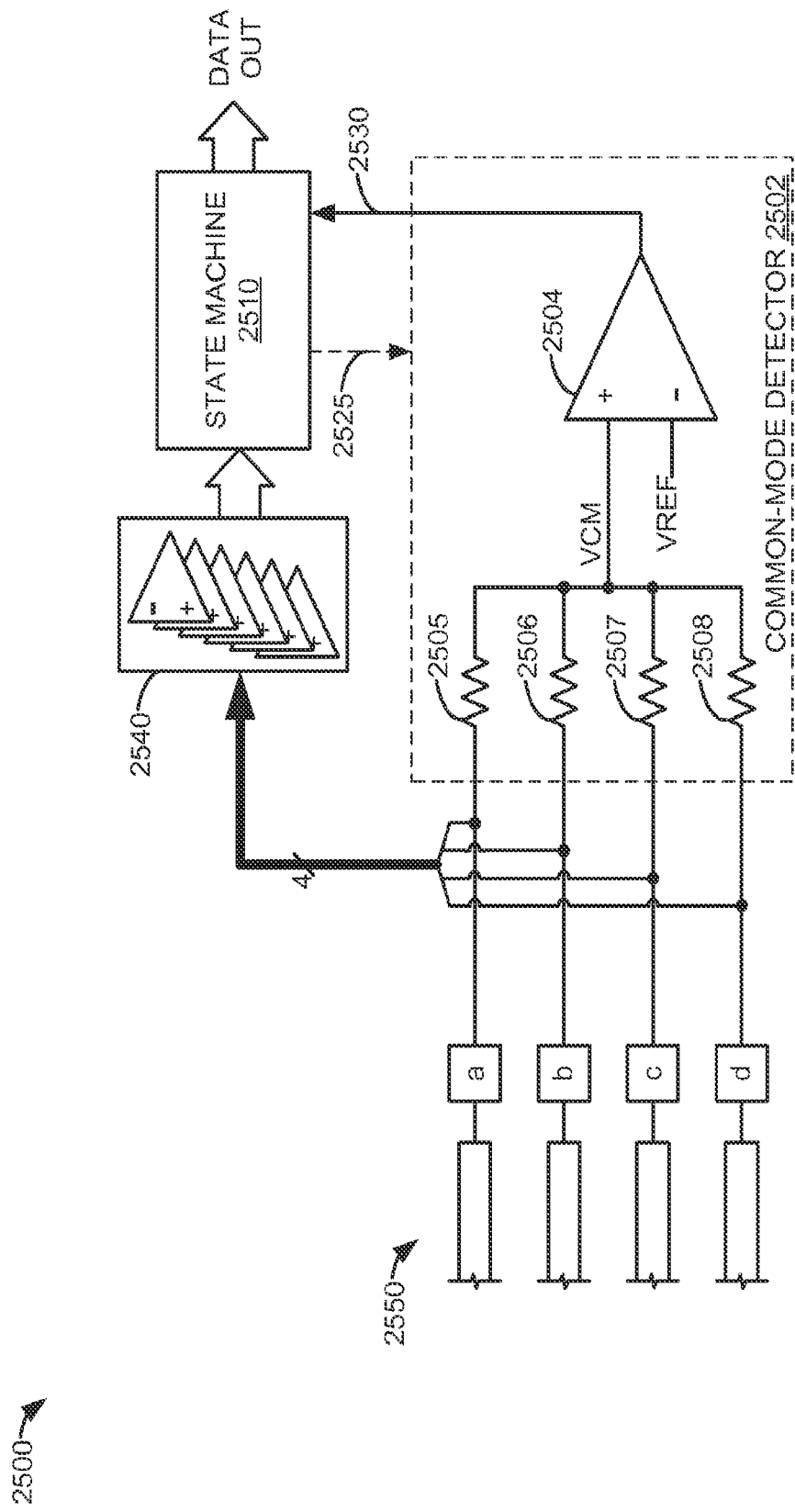
FIG. 25 is a block diagram of a system to control a state machine using differential-mode signals.

FIG. 25 is a block diagram of a system to control a state machine using differential-mode signals. In FIG. 25, system 2500 comprises: common-mode detector 2502; state machine 2510; release signal 2530; differential receivers 2540; and, differential-mode signal lines 2550. System 2500 may optionally also include power-down signal 2525. Common-mode detector 2502 includes comparator 2504. State machine 2510 outputs data (e.g., $b_0 b_1$ from Table 8) received via differential-mode signals 2550

Differential-mode signals 2550 are comprised of four individual links a, b, c, and d. Individual links a, b, c, and d may correspond to the bits of codewords described in Tables 5 and 6. Differential receivers 2540 may compare combinations of pairs of individual communication links a, b, c, and d (i.e., a and b, a and c, ..., c and d). These combinations may be all of the possible combinations of the individual links (e.g., as shown in Tables 5 and 6). In another embodiment, these combinations may be selected pairs (e.g., a and b form a first combination, c and d form a second combination, thus there are two differential-mode signals.) The outputs of differential receivers 2540 are input to decoder state machine 2510.

The individual links a, b, c, and d of differential-mode signals 2550 are each tied to a common node (VCM) through series resistors 2505-2508. In an embodiment, the voltage on VCM represents the average (or common-mode) voltage on the individual links a, b, c, and d. VCM is coupled to a first input of comparator 2504. A second input of comparator 2504 is coupled to a reference voltage VREF. The output of comparator 2504, signal 2530, is coupled to state machine 2510. Signal 2530 is also an output of common-mode detector 2502.

Common-mode detector 2502 can to detect transitions of the common-mode of differential-mode signals 2550, as represented by VCM, from a first common-mode signal level which is below, or above, VREF to a second common-mode signal level which is above, or below, VREF, respectively. These transitions are passed to state machine 2510 via signal 2530. State machine 2510 may use these transitions to determine a change in a state of the communication channel comprised of differential-mode signals 2550 based on output signal 2530 from common-mode detector 2502.

State machine 2510 may select the state of the communication channel from a group of states that includes an idle state. An idle state may be a state where the differential-mode signals 2550 are not carrying data. State machine 2510 may use the transition from the first common-mode signal level to the second common-mode signal level as a signal of the start of a burst. State machine 2510 may receive the transition from the first common-mode signal level to the second common-mode signal level bit synchronously with the first bit on the differential-mode signal.

FIG. 26A is a timing diagram illustrating a burst of data carried by differential-mode signals. In FIG. 26A, the voltages on individual links a, b, c, and d and their common-mode voltage, VCM, are shown. During the pre-burst time interval, all of the individual links a, b, c, and d are at a high logic voltage level ($V_H$). Thus, VCM is at $V_H$ during the pre-burst time interval. During the first bit time of the burst time interval, certain one of the individual links a, b, c, and d switch to low logic voltage levels ($V_L$) in order to communicate data via voltage differences between the individual links a, b, c, and d. The individual links a, b, c, and d then switch between the appropriate logic levels to communicate data during the burst state.

In an embodiment, during a burst, the number of the individual links a, b, c, and d that are at $V_L$ and the number of the individual links a, b, c, and d that are at $V_H$ is equal. Thus, VCM will be approximately the average of $V_H$ and $V_L$. This is shown in FIG. 26A as $V_{mid}$. This is also shown by the transition of VCM from $V_H$ to $V_{mid}$ at the start of the burst time interval. At the end of a burst time interval, all of the individual links a, b, c, and d are returned to $V_H$. Thus, VCM is at $V_H$ during the post-burst time interval.

Common-mode detector 2502 can detect these changes in VCM by setting VREF to a voltage that is between $V_{mid}$ and $V_H$. These transitions in VCM therefore signal changes in the state of a communication channel formed by differential-mode signals 2550 to state machine 2502. The state may be signaled by VCM being more than VREF during idle state periods (e.g., pre-burst and post-burst time intervals), and VCM being less than VREF during bursts.

FIG. 26B is a timing diagram illustrating a burst of data carried by differential-mode signals. In FIG. 26B, during the pre-burst time interval, all of the individual links a, b, c, and d are at the low logic voltage level ($V_L$). Thus, VCM is at $V_L$ during the pre-burst time interval. During the first bit time of the burst time interval, certain one of the individual links a, b, c, and d switch to high logic voltage levels ($V_H$) in order to communicate data via voltage differences between the individual links a, b, c, and d.

In an embodiment, during a burst, the number of the individual links a, b, c, and d that are at $V_L$ and the number of the individual links a, b, c, and d that are at $V_H$ is equal. This is shown by the transition of VCM from $V_L$ to $V_{mid}$ at the start of the burst time interval. At the end of a burst time interval, all of the individual links a, b, c, and d are returned to $V_L$. Thus, VCM is at $V_L$ during the post-burst time interval.

Common-mode detector 2502 can detect these changes in VCM by setting VREF to a voltage that is between $V_{mid}$ and $V_L$. These transitions in VCM therefore signal changes in the state of a communication channel formed by differential-mode signals 2550 to state machine 2502. The state may be signaled by VCM being less than VREF during idle state periods (e.g., pre-burst and post-burst time intervals), and VCM being more than VREF during bursts.

Figure 27A:
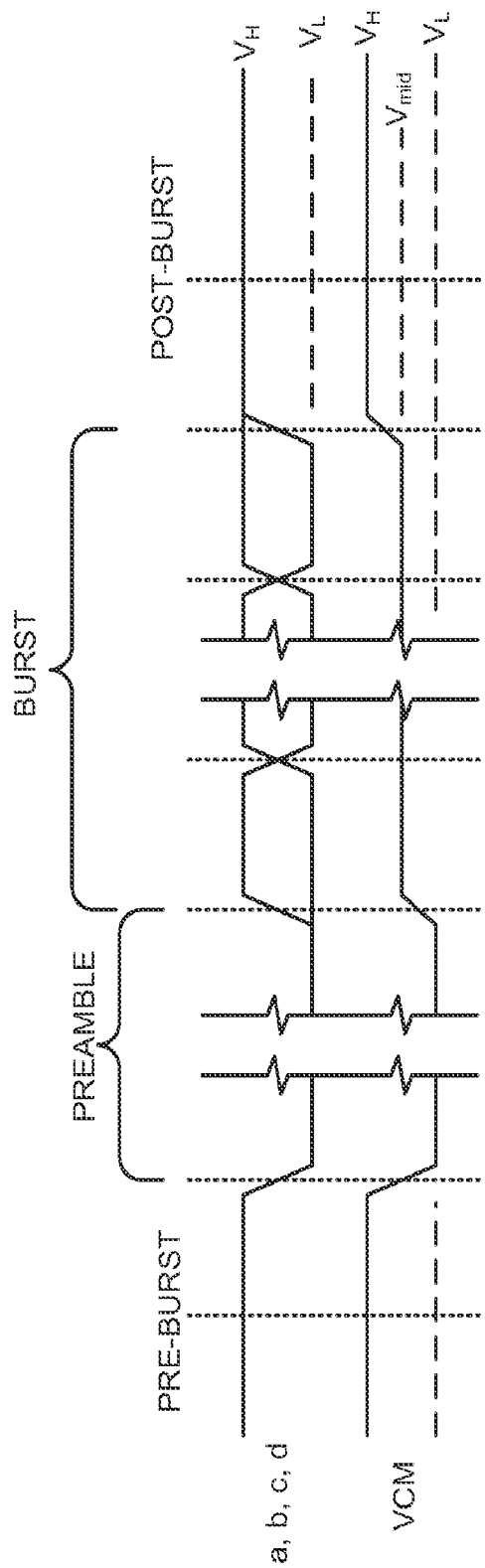
FIG. 27A is a timing diagram illustrating a preamble and a burst of data carried by differential-mode signals.

FIG. 27A is a timing diagram illustrating a preamble and a burst of data carried by differential-mode signals. In FIG. 27A, during the pre-burst time interval, all of the individual links a, b, c, and d are at the high logic voltage level ($V_H$). Thus, VCM is at $V_H$ during the pre-burst time interval. The state of the communication channel formed by differential-mode signals 2550 then switches to communicating a preamble. During the preamble time interval, all of the individual links a, b, c, and d are at the low logic voltage level ($V_L$). Thus, VCM is at $V_L$ during the preamble state time interval. The preamble state is followed by a burst state. During the first bit time of the burst time interval, certain one of the individual links a, b, c, and d switch to, a high logic voltage levels ($V_H$) in order to communicate data via voltage differences between the individual links a, b, c, and d.

In an embodiment, during a burst, the number of the individual links a, b, c, and d that are at $V_L$ and the number of the individual links a, b, c, and d that are at $V_H$ is equal. This is shown by the transition of VCM from $V_L$ to $V_{mid}$ at the start of the burst time interval. At the end of a burst time interval, all of the individual links a, b, c, and d are returned to $V_H$. Thus, VCM is at $V_H$ during the post-burst time interval.

Common-mode detector 2502 can detect the change in VCM from the pre-burst state to the preamble by setting VREF to a voltage that is less than $V_H$. Common-mode detector 2502 can detect the change in VCM from the preamble state to the burst state by setting VREF to a voltage that is between $V_{mid}$ and $V_L$. These transitions in VCM therefore signal changes in the state of a communication channel formed by differential-mode signals 2550 to state machine 2502. The state may be signaled by VCM being more than $V_{mid}$ during idle state periods (e.g., pre-burst and post-burst time intervals), VCM being less than $V_{mid}$ during preamble periods, and VCM being approximately $V_{mid}$ during bursts.

FIG. 27B is a timing diagram illustrating a preamble and a burst of data carried by differential-mode signals. In FIG. 27B, during the pre-burst time interval, all of the individual links a, b, c, and d are at an intermediate voltage level (e.g., $V_{mid}$). Thus, VCM is shown at $V_{mid}$ during the pre-burst time interval. The state of the communication channel formed by differential-mode signals 2550 then switches to communicating a preamble. During the preamble time interval, all of the individual links a, b, c, and d are at the low logic voltage level ($V_L$). Thus, VCM is at $V_L$ during the preamble state time interval. The preamble state is followed by a burst state. During the first bit time of the burst time interval, certain one of the individual links a, b, c, and d switch to, a high logic voltage levels ($V_H$) in order to communicate data via voltage differences between the individual links a, b, c, and d.

In an embodiment, during a burst, the number of the individual links a, b, c, and d that are at $V_L$ and the number of the individual links a, b, c, and d that are at $V_H$ is equal. This is shown by the transition of VCM from $V_L$ to $V_{mid}$ at the start of the burst time interval. At the end of a burst time interval, all of the individual links a, b, c, and d are driven to $V_H$. Thus, VCM is at $V_H$ during the post-burst time interval.

Common-mode detector 2502 can detect the change in VCM from the pre-burst state to the preamble by setting VREF to a voltage that is less than $V_{mid}$. Common-mode detector 2502 can detect the change in VCM from the burst state to the post-burst state by setting VREF to a voltage that is between $V_{mid}$ and $V_H$. These transitions in VCM therefore signal changes in the state of a communication channel formed by differential-mode signals 2550 to state machine 2502. The state may be signaled by VCM being approximately $V_{mid}$ during idle state periods (e.g., pre-burst time intervals), VCM being less than $V_{mid}$ during preamble periods, VCM being approximately $V_{mid}$ during bursts, and VCM being greater than $V_{mid}$ during post-burst time periods.

Figure 28:
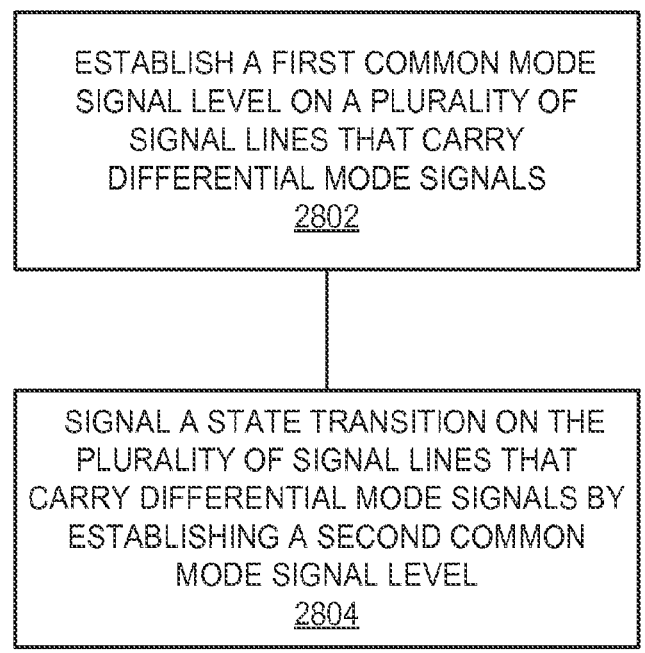
FIG. 28 is a flowchart illustrating a method of controlling a state machine.

FIG. 28 is a flowchart illustrating a method of controlling a state machine. The steps illustrated in FIG. 28 may be performed by, for example, one or more elements of communication system 100, communication system 200, and, communication system 600.

A first common-mode signal level is established on a plurality of signal lines that carry differential-mode signals (2802). For example, drivers 115 may establish a first common-mode signal level on communication channel 150. This common-mode signal level may indicate that communication channel 150 is in an idle (e.g., pre-burst) state. This common-mode signal level may correspond to the pre-burst common-mode signal levels shown in FIG. 26A, 26B, 27A, or 27B.

A state transition is signaled on the plurality of signal lines that carry differential-mode signals by establish a second common-mode signal level. For example, drivers 115 may signal a state transition on communication channel 150 by establishing a second common-mode signal level. This common-mode signal level may indicate that communication channel 150 is carrying data (e.g., in a burst state). This common-mode signal level may indicate that communication channel 150 has transitioned to a preamble state. This common-mode signal level may correspond to the preamble or burst common-mode signal levels shown in FIG. 26A, 26B, 27A, or 27B.

Figure 29:
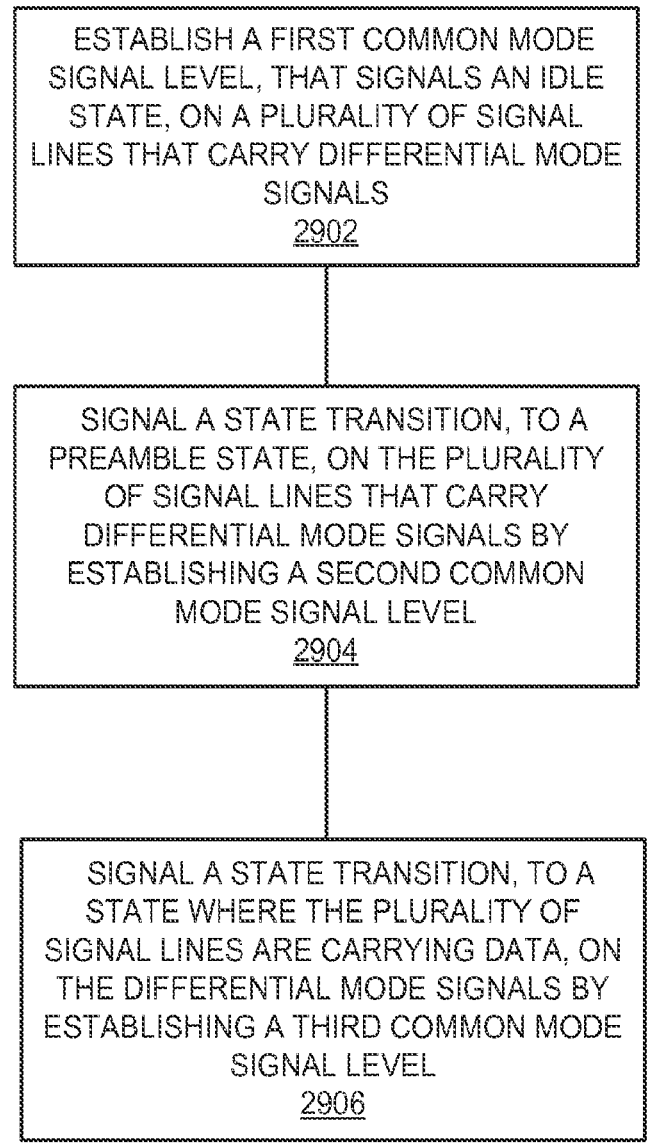
FIG. 29 is a flowchart illustrating a method of controlling a state machine using a preamble state.

FIG. 29 is a flowchart illustrating a method of controlling a state machine using a preamble state. The steps illustrated in FIG. 28 may be performed by, for example, one or more elements of communication system 100, communication system 200, and, communication system 600.

A first common-mode signal level, that signals an idle state, is established on a plurality of signal lines that carry differential-mode signals (2902). For example, For example, drivers 225 (or drivers 216 and 217) may establish a first common-mode signal level on communication channel 250. This common-mode signal level may indicate that communication channel 250 is in an idle (e.g., pre-burst) state. This first common-mode signal level may correspond to the pre-burst common-mode signal levels shown in FIG. 27A, or 27B.

A state transition, to a preamble state, is signal on the plurality of signal lines that carry differential-mode signals by establishing a second common-mode signal level (2904). For example, drivers 225 (or drivers 216 and 217) may signal a preamble state by establishing a second common-mode signal level on communication channel 250. This second common-mode signal level may indicate that communication channel 250 has transitioned to a preamble state. This second common-mode signal level may correspond to the preamble common-mode signal levels shown in FIG. 27A, or 27B.

A state transition, to a state where the plurality of signal lines are carrying data on the differential-mode signals, is signaled by establishing a third common-mode signal level (2906). For example, drivers 225 (or drivers 216 and 217) may signal a transition to the burst (e.g., data carrying) state by establishing a third common-mode signal level on communication channel 250. This third common-mode signal level may indicate that communication channel 250 has transitioned to the burst state. This third common-mode signal level may correspond to the burst state common-mode signal levels shown in FIG. 27A, or 27B. The third common-mode signal level may be approximately the same as the first common-mode signal level.

The methods, systems and devices described above may be implemented in computer systems, or stored by computer systems. The methods described above may also be stored on a computer readable medium. Devices, circuits, and systems described herein may be implemented using computer-aided design tools available in the art, and embodied by computer-readable files containing software descriptions of such circuits. This includes, but is not limited to systems 100, 200, 600, 2500, and their components. These software descriptions may be: behavioral, register transfer, logic component, transistor and layout geometry-level descriptions. Moreover, the software descriptions may be stored on storage media or communicated by carrier waves.

Data formats in which such descriptions may be implemented include, but are not limited to: formats supporting behavioral languages like C, formats supporting register transfer level (RTL) languages like Verilog and VHDL, formats supporting geometry description languages (such as GDSII, GDSIII, GDSIV, CIF, and MEBES), and other suitable formats and languages. Moreover, data transfers of such files on machine-readable media may be done electronically over the diverse media on the Internet or, for example, via email. Note that physical files may be implemented on machine-readable media such as: 4 mm magnetic tape, 8 mm magnetic tape, 3½ inch floppy media, CDs, DVDs, and so on.

Figure 30:
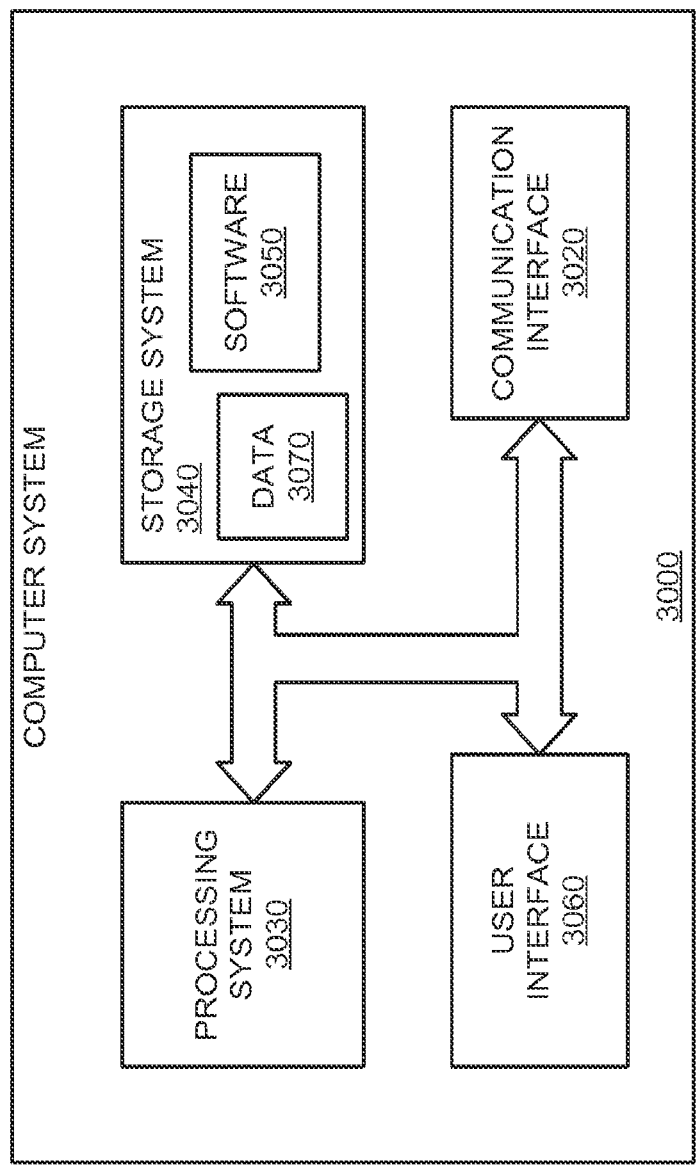
FIG. 30 is a block diagram of a computer.

FIG. 30 illustrates a block diagram of a computer system. Computer system 3000 includes communication interface 3020, processing system 3030, storage system 3040, and user interface 3060. Processing system 3030 is operatively coupled to storage system 3040. Storage system 3040 stores software 3050 and data 3070. Processing system 3030 is operatively coupled to communication interface 3020 and user interface 3060. Computer system 3000 may comprise a programmed general-purpose computer. Computer system 3000 may include a microprocessor. Computer system 3000 may comprise programmable or special purpose circuitry. Computer system 3000 may be distributed among multiple devices, processors, storage, and/or interfaces that together comprise elements 3020-3070.

Communication interface 3020 may comprise a network interface, modem, port, bus, link, transceiver, or other communication device. Communication interface 3020 may be distributed among multiple communication devices. Processing system 3030 may comprise a microprocessor, microcontroller, logic circuit, or other processing device. Processing system 3030 may be distributed among multiple processing devices. User interface 3060 may comprise a keyboard, mouse, voice recognition interface, microphone and speakers, graphical display, touch screen, or other type of user interface device. User interface 3060 may be distributed among multiple interface devices. Storage system 3040 may comprise a disk, tape, integrated circuit, RAM, ROM, network storage, server, or other memory function. Storage system 3040 may be a computer readable medium. Storage system 3040 may be distributed among multiple memory devices.

Processing system 3030 retrieves and executes software 3050 from storage system 3040. Processing system may retrieve and store data 3070. Processing system may also retrieve and store data via communication interface 3020. Processing system 3050 may create or modify software 3050 or data 3070 to achieve a tangible result. Processing system may control communication interface 3020 or user interface 3070 to achieve a tangible result. Processing system may retrieve and execute remotely stored software via communication interface 3020.

Software 3050 and remotely stored software may comprise an operating system, utilities, drivers, networking software, and other software typically executed by a computer system. Software 3050 may comprise an application program, applet, firmware, or other form of machine-readable processing instructions typically executed by a computer system. When executed by processing system 3030, software 3050 or remotely stored software may direct computer system 3000 to operate as described herein.

The above description and associated figures teach the best mode of the invention. The following claims specify the scope of the invention. Note that some aspects of the best mode may not fall within the scope of the invention as specified by the claims. Those skilled in the art will appreciate that the features described above can be combined in various ways to form multiple variations of the invention. As a result, the invention is not limited to the specific embodiments described above, but only by the following claims and their equivalents.

What is claimed is:

1. An integrated circuit, comprising:
   an encoder circuit to encode a series of 2-bit data words into a series of 4-bit code; and
   a transmitter circuit to transmit in succession the series of 4-bit code words over a set of 4 links that convey respective bits in each of the series of code words;
   wherein the encoder is configured to select a code word out of a set of six symbols for each of the series of data words, the set of six symbols including a first group of two symbols, a second group of two symbols, and a third group of two symbols, and wherein the encoder is further configured to encode the series of 2-bit data words such that any two consecutive code words in the series of 4-bit code words are selected from two different groups of symbols.

2. The integrated circuit of claim 1, wherein each of the set of six symbols has a balanced bit pattern.

3. The integrated circuit of claim 2, wherein the series of code words are selected such that between every two consecutive code words, two of the set of 4 links are transitioning and the two links that are transitioning are transitioning in opposite directions.

4. The integrated circuit of claim 2, wherein the first group of two symbols are 0011 and 1100, the second group of two symbols are 0110 and 1001, and the third group of two symbols are 0101 and 1010.

5. The integrated circuit of claim 1, wherein the encoder is further configured to be in one of three different states associated with respective groups of the set of six symbols, and wherein the encoder is further configured to select the 4 bits (a,b,c,d) of the code words corresponding to a respective 2-bit data word in accordance with the following:

$a = (\sim S_0 S_1) ? \sim (b_0 \text{ XOR } b_1) : b_0$;
$b = (\sim S_1) ? \sim (b_0 \text{ XOR } b_1) : (S_0 \text{ XOR } b_0)$;
$c = (S_0 S_1) ? \sim (b_0 \text{ XOR } b_1) : (b_0 \text{ XOR } b_1)$;
$d = (S_0 S_1) ? \sim (b_0 \text{ XOR } b_1) : \sim b_0$; and, where $b_0$ and $b_1$ are the 2 bits of the respective data word and $S_0$ and $S_1$ are a 2-bit representation of a current state of the encoder.

6. The integrated circuit of claim 5, wherein a next state encoder is determined by:

$S_0+ = \sim S_0 \text{ \& } b_1$ and $S_1+ \sim (S_1 \text{ \& } \sim b_1)$, where $S_0+$ and $S_1+$ are a next 2-bit representation of the next state of the state machine.

* * * * *